(12) United States Patent
Onuki et al.

(10) Patent No.: US 10,192,871 B2
(45) Date of Patent: Jan. 29, 2019

(54) SEMICONDUCTOR DEVICE

(71) Applicant: Semiconductor Energy Laboratory Co., Ltd., Atsugi-shi, Kanagawa-ken (JP)

(72) Inventors: Tatsuya Onuki, Atsugi (JP); Kiyoshi Kato, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/698,138

(22) Filed: Sep. 7, 2017

(65) Prior Publication Data

US 2018/0090498 A1    Mar. 29, 2018

(30) Foreign Application Priority Data

Sep. 23, 2016   (JP) .................. 2016-185129

(51) Int. Cl.
| | | |
|---|---|---|
| *H01L 27/105* | (2006.01) | |
| *H01L 23/34* | (2006.01) | |
| *H01L 27/12* | (2006.01) | |
| *H01L 29/786* | (2006.01) | |
| *H03K 17/687* | (2006.01) | |

(Continued)

(52) U.S. Cl.
CPC ......... *H01L 27/1052* (2013.01); *G11C 5/025* (2013.01); *G11C 11/404* (2013.01); *G11C 11/4097* (2013.01); *H01L 23/34* (2013.01); *H01L 27/10814* (2013.01); *H01L 27/124* (2013.01); *H01L 27/1207* (2013.01); *H01L 27/1225* (2013.01); *H01L 27/1255* (2013.01); *H01L 29/7869* (2013.01); *H01L 29/78648* (2013.01); *H03K 17/687* (2013.01); *G11C 11/40* (2013.01); *G11C 11/4072* (2013.01); *G11C 11/4094* (2013.01); *G11C 2211/4016* (2013.01)

(58) Field of Classification Search
None
See application file for complete search history.

(56) References Cited

U.S. PATENT DOCUMENTS 7,112,997 B1 * 9/2006 Liang .................. G06F 17/5054
                                                        257/E21.703
8,737,109 B2    5/2014 Yamazaki et al.
(Continued)

FOREIGN PATENT DOCUMENTS

| JP | 2012-069932 A | 4/2012 |
| JP | 2012-146965 A | 8/2012 |
| JP | 2013-168631 A | 8/2013 |

*Primary Examiner* — Jeffery S Zweizig
(74) *Attorney, Agent, or Firm* — Robinson Intellectual Property Law Office; Eric J. Robinson

(57) ABSTRACT

To provide a semiconductor device in which the on-state current is high and the operation speed is high. The semiconductor device includes a transistor, a first circuit, and a second circuit. The transistor includes a first gate and a second gate. The first gate and the second gate overlap with each other with a semiconductor layer positioned therebetween. The first circuit includes a temperature sensor. The temperature sensor obtains temperature information. The first circuit is configured to apply a voltage to the second gate depending on the temperature information. The first circuit preferably includes a comparator. The second circuit is configured to apply a negative voltage to the second gate and hold the negative voltage.

16 Claims, 28 Drawing Sheets

(51) Int. Cl.
*G11C 5/02* (2006.01)
*G11C 11/404* (2006.01)
*G11C 11/4097* (2006.01)
*H01L 27/108* (2006.01)
G11C 11/40 (2006.01)
G11C 11/4072 (2006.01)
G11C 11/4094 (2006.01)

(56) References Cited

U.S. PATENT DOCUMENTS

| | | |
|---|---|---|
| 9,024,317 B2 | 5/2015 | Endo et al. |
| 9,312,280 B2 | 4/2016 | Kobayashi |
| 9,818,750 B2 | 11/2017 | Ohshima et al. |
| 2013/0300462 A1 | 11/2013 | Koyama et al. |
| 2016/0248419 A1 | 8/2016 | Koyama et al. |
| 2017/0062433 A1 | 3/2017 | Miyairi et al. |
| 2017/0179294 A1 | 6/2017 | Kato et al. |
| 2017/0186473 A1 | 6/2017 | Ikeda et al. |
| 2017/0207244 A1 | 7/2017 | Kato |

\* cited by examiner

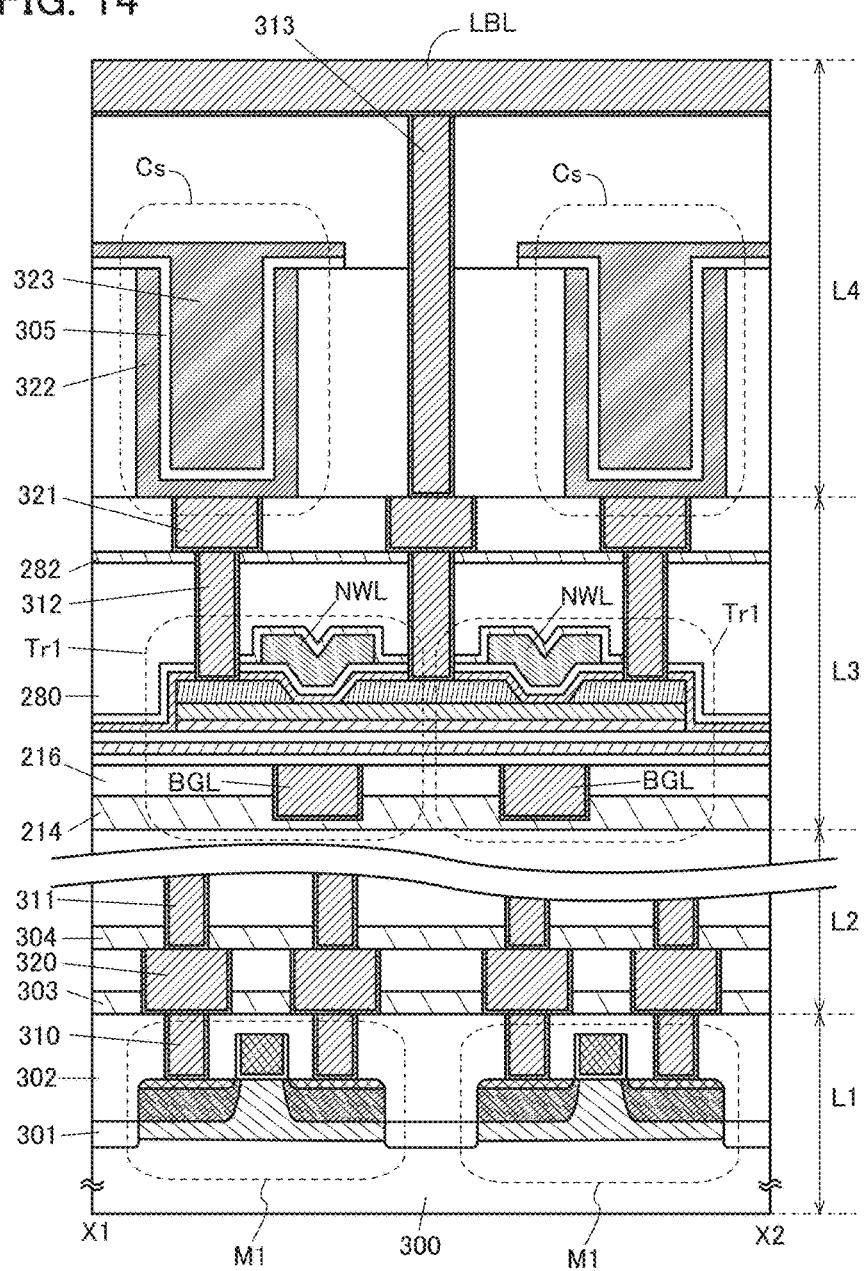

FIG. 17
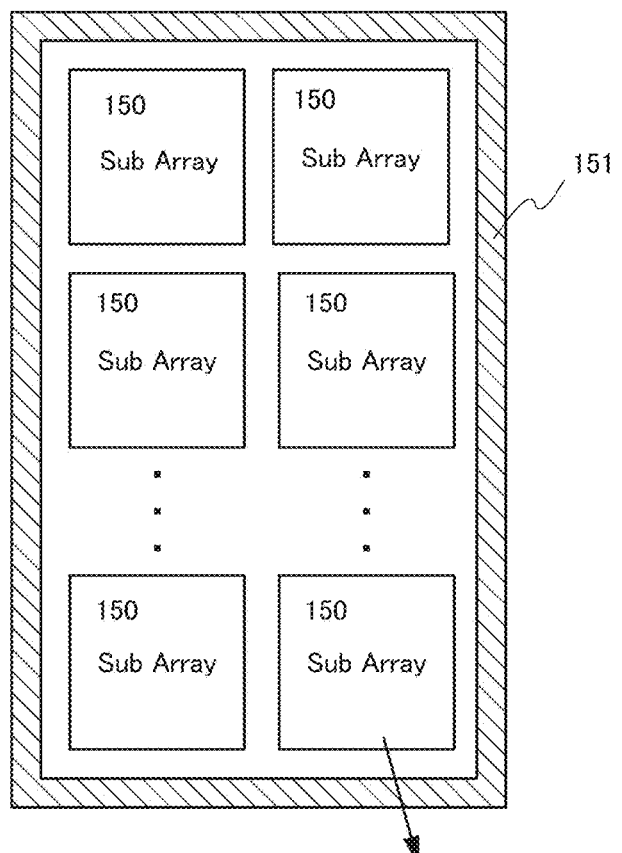
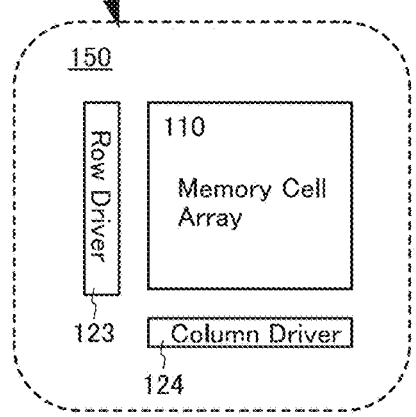

SEMICONDUCTOR DEVICE

BACKGROUND OF THE INVENTION

1. Field of the Invention

One embodiment of the present invention relates to a semiconductor device.

One embodiment of the present invention relates to an object, a method, or a manufacturing method. One embodiment of the present invention relates to a process, a machine, manufacture, and a composition of matter. One embodiment of the present invention relates to a method for driving the semiconductor device, or a method for manufacturing the semiconductor device.

In this specification and the like, a semiconductor device generally means a device that can function by utilizing semiconductor characteristics. A memory device, a display device, an electro-optical device, a power storage device, a semiconductor circuit, and an electronic device include a semiconductor device in some cases.

2. Description of the Related Art

A transistor including an oxide semiconductor (OS) in a channel formation region (hereinafter referred to as an OS transistor) is known. A variety of semiconductor devices including OS transistors have been proposed.

Patent Document 1 discloses an example in which an OS transistor is used in a dynamic random access memory (DRAM). The OS transistor has extremely low leakage current in an off state (off-state current); thus, a low-power DRAM having a low refresh frequency can be formed.

Patent Document 2 discloses a nonvolatile memory including an OS transistor. Unlike the flash memory, the nonvolatile memory has unlimited cycling capability, can easily operate at high speed, and consumes less power.

The off-state current of a memory including the OS transistor (hereinafter referred to as an OS memory) can be reduced when the threshold voltage of the OS transistor is increased, so that the data holding characteristics of the memory can be improved. Patent Document 2 discloses an example in which an OS transistor has a second gate (also referred to as a back gate) to control the threshold voltage of the OS transistor so that the off-state current is lowered.

In order to hold data of the OS memory for a long period, a negative potential needs to be continuously applied to the second gate of the OS transistor. Patent Documents 2 and 3 each disclose a structure example of a circuit for driving a second gate of an OS transistor.

REFERENCES

Patent Documents

[Patent Document 1] Japanese Published Patent Application No. 2013-168631
[Patent Document 2] Japanese Published Patent Application No. 2012-069932
[Patent Document 3] Japanese Published Patent Application No. 2012-146965

SUMMARY OF THE INVENTION

One object of one embodiment of the present invention is to provide a semiconductor device with large on-state current. One object of one embodiment of the present invention is to provide a semiconductor device that operates at high speed. One object of one embodiment of the present invention is to provide a semiconductor device capable of holding data for a long time. One object of one embodiment of the present invention is to provide a semiconductor device with low power consumption. One object of one embodiment of the present invention is to provide a novel semiconductor device.

Note that the description of a plurality of objects does not mutually preclude the existence. One embodiment of the present invention does not necessarily achieve all the objects listed above. Objects other than those listed above are apparent from the description of the specification, drawings, and claims, and also such objects could be an object of one embodiment of the present invention.

One embodiment of the present invention is a semiconductor device including a transistor and a first circuit. The transistor includes a first gate and a second gate. The first gate and the second gate overlap with each other with a semiconductor layer positioned therebetween. The first circuit includes a temperature sensor. The temperature sensor obtains temperature information. The first circuit applies, to the second gate, a voltage depending on the temperature information.

In the above embodiment, the first circuit preferably includes a comparator.

In the above embodiment, the semiconductor layer preferably includes a metal oxide.

In the above embodiment, a second circuit that applies a negative voltage to the second gate of the transistor is preferably included.

In the above embodiment, the second circuit can hold a negative voltage.

In the above embodiment, the second circuit preferably includes a transistor including a metal oxide in its channel formation region.

In one embodiment of the present invention, a semiconductor device with large on-state current can be provided. In one embodiment of the present invention, a semiconductor device that operates at high speed can be provided. In one embodiment of the present invention, a semiconductor device capable of holding data for a long time can be provided. In one embodiment of the present invention, a semiconductor device with low power consumption can be provided. In one embodiment of the present invention, a novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIG. 14 is a cross-sectional view illustrating a structure example of a memory device.

FIG. 17 is a schematic top view illustrating a structure example of a memory device.

DETAILED DESCRIPTION OF THE INVENTION

Figure 1:
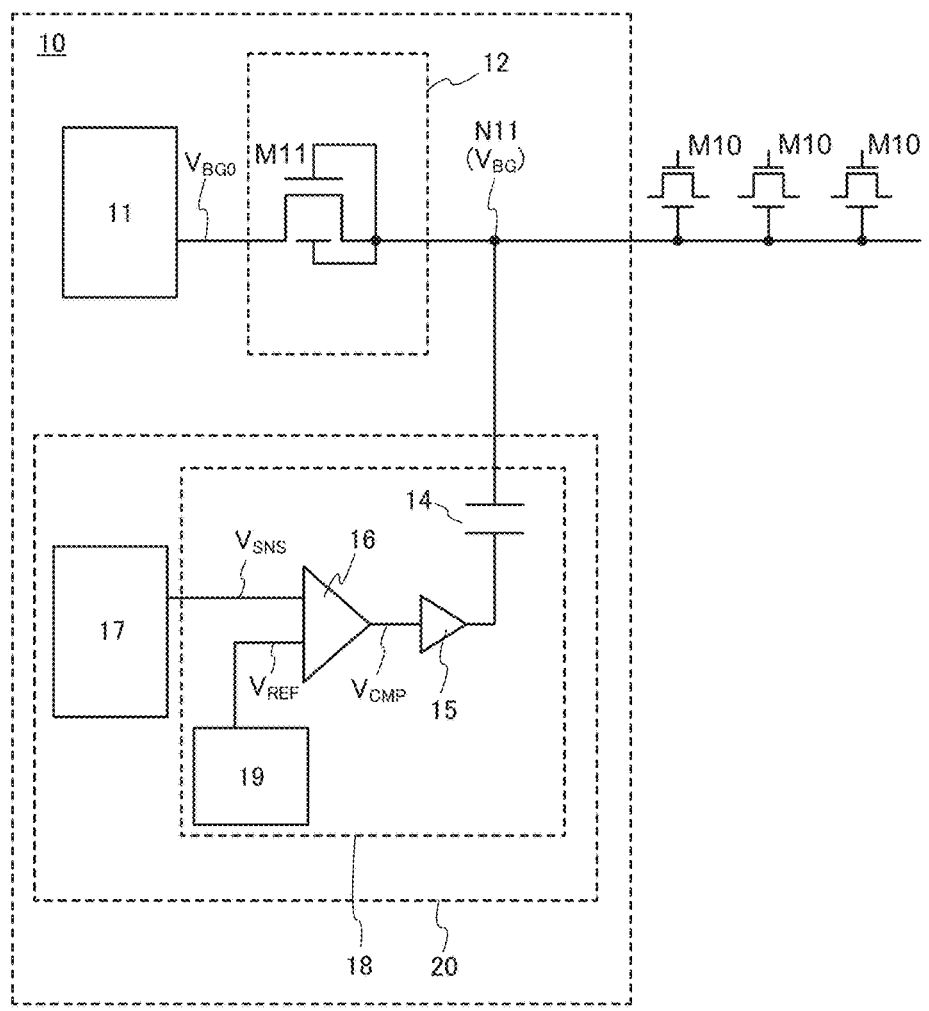
FIG. 1 is a circuit diagram showing a structure example of a semiconductor device.

Embodiments according to the present invention will be described in detail with reference to the accompanying drawings. It will be readily appreciated by those skilled in the art that modes and details of the present invention can be modified in various ways without departing from the spirit and scope of the present invention. Therefore, the present invention should not be limited to the descriptions of embodiments and an example below.

Note that in structures of the present invention described below, the same portions or portions having similar functions are denoted by the same reference numerals in different drawings, and a description thereof is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification, a high power supply voltage and a low power supply voltage are sometimes referred to as H level (or VDD) and L level (or GND), respectively.

Furthermore, in this specification, any of the embodiments and the example described below can be combined as appropriate. In addition, in the case where a plurality of structure examples are described in one embodiment, some of the structure examples can be combined as appropriate.

In this specification and the like, a metal oxide means an oxide of metal in a broad sense. Metal oxides are classified into an oxide insulator, an oxide conductor (including a transparent oxide conductor), an oxide semiconductor, and the like. For example, a metal oxide used in a semiconductor layer of a transistor is called an oxide semiconductor in some cases. An OS transistor refers to a transistor including a metal oxide or an oxide semiconductor. In this specification and the like, a metal oxide including nitrogen is also called a metal oxide in some cases.

(Embodiment 1)

<<Semiconductor Device 10>>

FIG. 1 is a circuit diagram illustrating a structure example of a semiconductor device 10 of one embodiment of the present invention. The semiconductor device 10 includes a voltage generation circuit 11, a voltage holding circuit 12, and a correction circuit 20. The voltage generation circuit 11 is electrically connected to the voltage holding circuit 12, and the voltage holding circuit 12 is electrically connected to the correction circuit 20. Note that a node of the correction circuit 20 and the voltage holding circuit 12 is referred to as a node N11.

Transistors M10 represent transistors used in a variety of circuits such as a memory circuit, an arithmetic circuit, and a pixel circuit. Although three transistors M10 are illustrated in FIG. 1, one embodiment of the present invention is not limited thereto, and the semiconductor device 10 may be connected to more transistors M10. Note that the transistors M10 are described as n-channel transistors below.

The transistors M10 each include a first gate and a second gate. The second gate has a function of controlling threshold voltage ($V_{th0}$) of each of the transistors M10. In each of the transistors M10, the first gate and the second gate preferably overlap with each other in a region with a semiconductor layer provided therebetween. The semiconductor device 10 is electrically connected to the second gate of each of the transistors M10 through the node N11.

The semiconductor device 10 has a function of writing voltage $V_{BG}$ to the second gate of each of the transistors M10 and holding the voltage. For example, in the case where a negative potential is supplied as voltage $V_{BG}$, $V_{th0}$ of the transistors M10 can be kept high while the negative potential of each of the second gates is held. When $V_{th0}$ of each of the transistors M10 is kept high, the transistors M10 can be prevented from being normally-on and therefore power consumption of the whole semiconductor device including the transistors M10 can be reduced. For example, in the case where the transistor M10 is used as a selection transistor of a memory cell, electric charge in a capacitor functioning as a storage can be held for a long time.

<Voltage Generation Circuit 11>

Figure 2A:
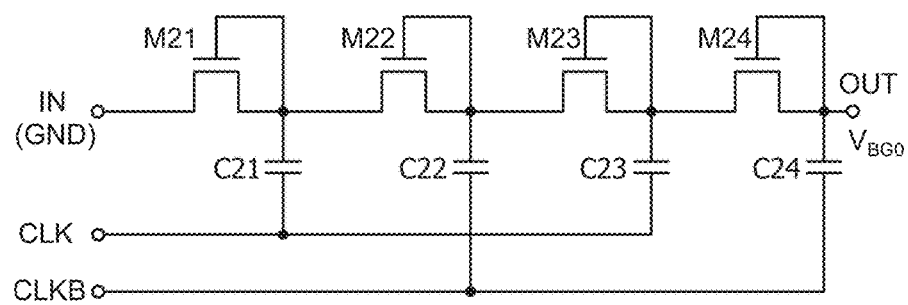
FIGS. 2A and 2B are circuit diagrams each illustrating a structure example of a voltage generation circuit.
Figure 2B:
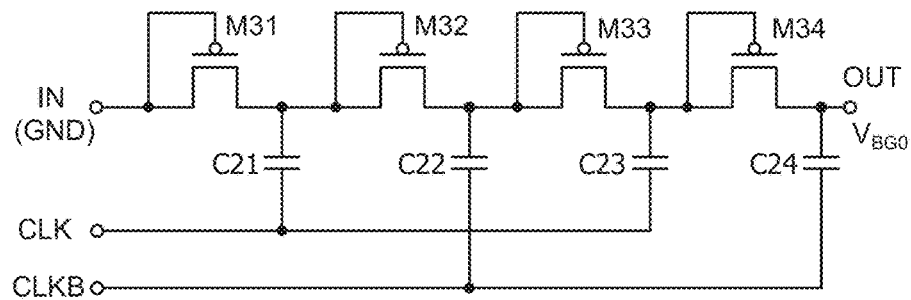

FIGS. 2A and 2B show circuit structure examples of the voltage generation circuit 11. These are step-down charge pump circuits, in each of which GND is input to an input terminal IN, and $V_{BG0}$ is output from an output terminal OUT. The number of stages of fundamental circuits in the charge pump circuit is four in the examples shown here; however, it is not limited to this, and the charge pump circuit may be configured with given stages of fundamental circuits.

As illustrated in FIG. 2A, a voltage generation circuit 11a includes transistors M21 to M24 and capacitors C21 to C24. Note that in the following description, the transistors M21 to M24 are n-channel transistors.

The transistors M21 to M24 are connected in series between the input terminal IN and the output terminal OUT, each of which has a structure in which a gate and a first electrode are connected to each other so that the transistor functions as a diode. The capacitors C21 to C24 are connected to the gates of the transistors M21 to M24, respectively.

To first electrodes of the capacitors C21 and C23 in the odd-numbered stages, CLK is input, and to first electrodes of the capacitors C22 and C24 in the even-numbered stages, CLKB is input. The CLKB is an inverted clock signal obtained by phase inversion of the CLK.

The voltage generation circuit 11a has a function of stepping down GND input to the input terminal IN to generate $V_{BG0}$. The voltage generation circuit 11a can generate a negative potential only by the supply of the CLK and CLKB.

The transistors M21 to M24 may be formed using OS transistors. The OS transistors are preferably used because the reverse current of the diode-connected transistors M21 to M24 can be reduced.

A voltage generation circuit 11b in FIG. 2B includes transistors M31 to M34 that are p-channel transistors. The description of the voltage generation circuit 11a is referred to for the other components.

<Voltage Holding Circuit 12>

The voltage holding circuit 12 includes a transistor M11 (FIG. 1). The transistor M11 includes a first gate and a second gate. In the transistor M11, the first gate and the second gate preferably overlap with each other with a semiconductor layer therebetween. Note that in the following description, the transistor M11 is an n-channel transistor.

A first terminal of the transistor M11 is electrically connected to the voltage generation circuit 11, and a second terminal of the transistor M11 is electrically connected to the node N11. The second terminal of the transistor M11 is electrically connected to the first gate of the transistor M11 and the second gate of the transistor M11. The transistor M11 functions as a diode.

The voltage holding circuit 12 has a function of applying the voltage $V_{BG}$ to the second gate of each of the transistors M10 and holding the voltage $V_{BG}$. The voltage $V_{BG0}$ generated by the voltage generation circuit 11 becomes the voltage $V_{BG}$ through voltage holding circuit 12. Note that the relation $V_{BG0}=V_{BG}-V_{th1}$ holds, where $V_{th1}$ represents the threshold voltage of the transistor M11.

Figure 3A:
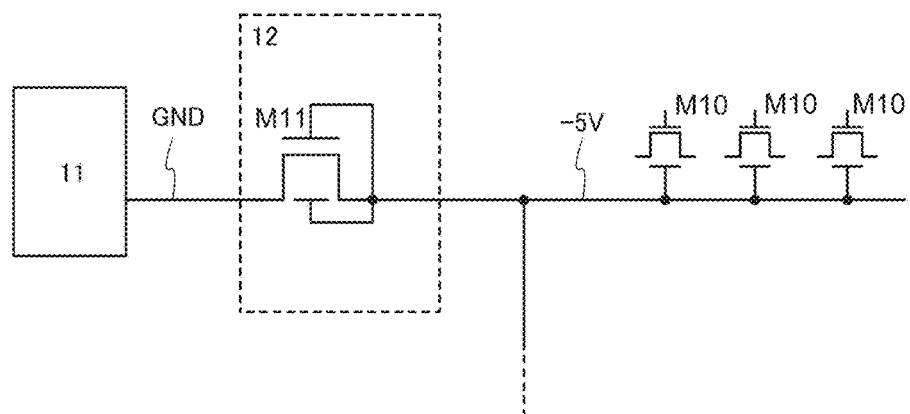
FIG. 3A is a circuit diagram illustrating the operation of a voltage holding circuit.

The transistor M11 has a function of writing a potential to the second gate of each of the transistors M10 and holding the potential. FIG. 3A illustrates an example in which a negative potential (−5 V) is written to the second gate of each of the transistors M10. $V_{th0}$ of the transistors M10 is shifted in the positive direction by the negative potential written to the second gate of each of the transistors M10. When the first terminal of the transistor M11 is set to GND, the written negative potential can be held, and the transistors M10 can maintain the normally-off state.

In FIG. 3A, $V_G$ of the transistor M11 is 0 V. When a drain current at $V_G=0$ V (hereinafter referred to as cutoff current) is sufficiently low, the transistor M11 interrupts the charge flow and the voltage holding circuit 12 can hold the negative potential for a long time.

The channel length of the transistor M11 is preferably longer than that of the transistor M10. In the case where the channel length of the transistor M10 is less than 1 μm, for example, the channel length of the transistor M11 is greater than or equal to 1 μm, preferably greater than or equal to 3 μm, further preferably greater than or equal to 5 μm, and still further preferably greater than or equal to 10 μm. The transistor M11 has a longer channel length, whereby the transistor M11 is not affected by a short-channel effect, and the cutoff current can be low. Furthermore, the withstand voltage between a source and a drain of the transistor M11 can be increased. The high withstand voltage between the source and the drain of the transistor M11 can facilitate a connection between the transistor M10 and the voltage generation circuit 11 generating a high voltage.

An OS transistor or a transistor including a wide-bandgap semiconductor in a channel formation region is preferably used as the transistor M11. The cutoff current is low and the withstand voltage between a source and a drain is high in the OS transistor and the transistor including a wide-bandgap semiconductor. Note that in this specification, the term "wide-bandgap semiconductor" is a semiconductor whose bandgap is 2.2 eV or greater. Examples of the wide-bandgap semiconductor include silicon carbide, gallium nitride, and diamond.

The transistor M11 is required to have the cutoff current lower than that of the transistor M10. In contrast, the transistor M10 is required to have the on-state current higher than that of the transistor M11. As described above, in the case where transistors having different required properties are manufactured over the same substrate, the transistors are formed using different semiconductors. The transistor M11 preferably includes a semiconductor having a wider bandgap than that of the transistor M10 in the channel formation region. The transistor M10 preferably includes a semiconductor having higher electron mobility than that of the transistor M11 in a channel formation region.

Note that the second gate of the transistor M11 need not be provided in some cases.

Figure 3B:
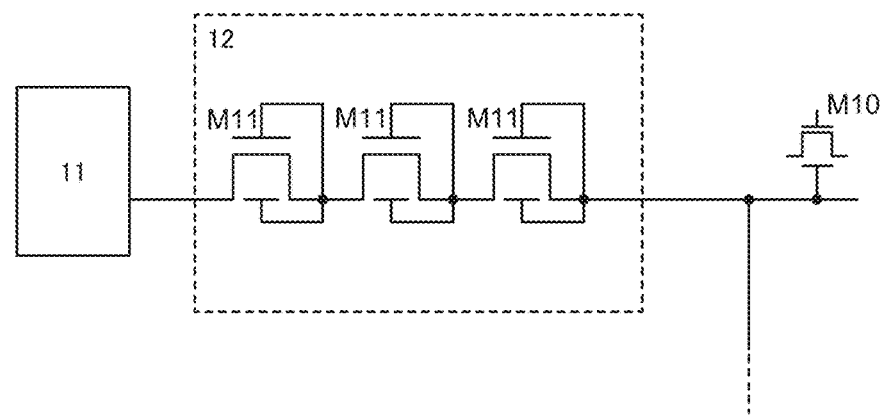
FIG. 3B is a circuit diagram illustrating a structure example of a voltage holding circuit.

The voltage generation circuit 12 may include a plurality of transistors M11 connected in series (FIG. 3B).

<Correction Circuit 20>

Figure 4:
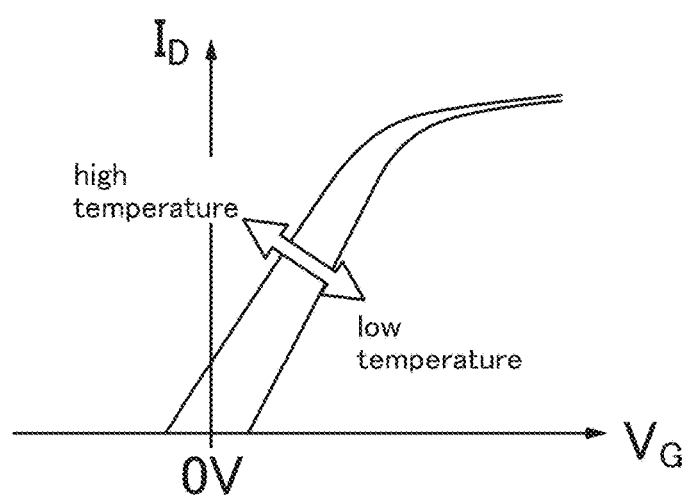
FIG. 4 is a schematic view illustrating the temperature dependence of the $V_G$-$I_D$ characteristics of an OS transistor.

FIG. 4 is a schematic view showing the temperature dependence of $V_G$ (gate voltage)-$I_D$ (drain current) characteristics of an OS transistor. As the temperature is decreased, the threshold voltage of an OS transistor is shifted in the positive direction and the on-state current of the OS transistor is decreased. Thus, the operation speed of a circuit is lowered. As the temperature is increased, the threshold voltage of the OS transistor is shifted in the negative direction and the subthreshold swing of the OS transistor is increased. Thus, the cutoff current is increased.

In the case where an OS transistor is used as the transistor M10, the threshold voltage ($V_{th0}$) is changed by the temperature as shown in FIG. 4. As the temperature is decreased, $V_{th0}$ is shifted in the positive direction. As the temperature is increased, $V_{th0}$ is shifted in the negative direction. This leads to a narrow temperature range in which a circuit can operate. Thus, the semiconductor device 10 preferably includes the correction circuit 20.

The correction circuit 20 includes a temperature sensor 17 and a voltage control circuit 18 (see FIG. 1).

The temperature sensor 17 has a function of sensing the temperature of the semiconductor device 10 and outputting voltage $V_{SNS}$. The temperature sensed by the temperature sensor 17 corresponds to $V_{SNS}$, which is analog data.

As the temperature sensor 17, for example, a resistance thermometer such as platinum, nickel, or copper, a thermistor, a thermocouple, an IC temperature sensor, or the like can be used.

The voltage control circuit 18 includes a reference voltage generation circuit 19, a comparator 16, a buffer 15, and a capacitor 14. The voltage control circuit 18 has a function of controlling a voltage that is applied to the second gate of each of the transistors M10 depending on the temperature information obtained from the temperature sensor 17. Note that a plurality of buffers 15 may be provided as necessary or the buffer 15 need not be provided in some cases.

The reference voltage generation circuit 19 has a function of generating reference voltage $V_{REF}$.

The comparator 16 compares $V_{SNS}$ obtained from the temperature sensor 17 and $V_{REF}$ obtained from the reference voltage generation circuit and outputs the comparison result as voltage $V_{CMP}$. $V_{CMP}$ is digital data and can be at H level or L level.

Next, the operation of the correction circuit 20 is considered. In this embodiment, the case is considered where $V_{BG}$ of −5 V is applied at a high temperature that is higher than or equal to 27° C. (room temperature) and $V_{BG}$ of −4.2 V is applied at a low temperature that is lower than 27° C., for example.

First, it is assumed that the temperature sensor 17 outputs a voltage of 0.8 V as $V_{SNS}$ at a temperature of 27° C. (room temperature), outputs a voltage lower than 0.8 V ($V_{SNS}$<0.8 V) at a temperature higher than 27° C., and outputs a voltage higher than 0.8 V ($V_{SNS}$>0.8 V) at a temperature lower than 27° C. Furthermore, it is assumed that the reference voltage generation circuit 19 outputs a voltage of 0.8 V as $V_{REF}$ regardless of the temperature. Furthermore, it is assumed that the voltage generation circuit 11 and the voltage holding circuit 12 generate a voltage of −5 V as $V_{BG}$ regardless of temperature.

In the case where the temperature sensor 17 senses a high temperature that is higher than or equal to 27° C., the relation $V_{SNS} \leq V_{REF}$ holds and the comparator 16 outputs L level ($V_{CMP}$=0 V). Thus, the semiconductor device 10 keeps $V_{BG}$=−5 V.

In the case where the temperature sensor 17 senses a low temperature that is lower than 27° C., the relation $V_{SNS}>V_{REF}$ holds and the comparator 16 outputs H level ($V_{CMP}$=1.2 V). The potential of the node N11 is increased by capacitive coupling with the capacitor 14. For example, $V_{BG}$ is changed to −4.2 V. As a result, correction is made so that $V_{th0}$ of the transistor M10 is shifted in the negative direction.

By the above-described operation, low $V_{BG}$ (−5 V) is applied to the second gate of the transistor M10 at a high temperature, and high $V_{BG}$ (−4.2 V) is applied to the second gate of the transistor M10 at a low temperature. Consequently, the influence of temperature on $V_{th0}$ of the transistor M10 can be reduced. The transistor M10 can keep both high on-state current and low cutoff current.

In FIG. 1, the voltage control circuit 18 includes one comparator, but one embodiment of the present invention is not limited thereto. The voltage control circuit 18 may include a plurality of comparators. With the plurality of comparators, the temperature ranges for correction in the voltage control circuit 18 can be set in more detail, e.g., a high temperature, a middle temperature, and a low temperature.

Figure 5:
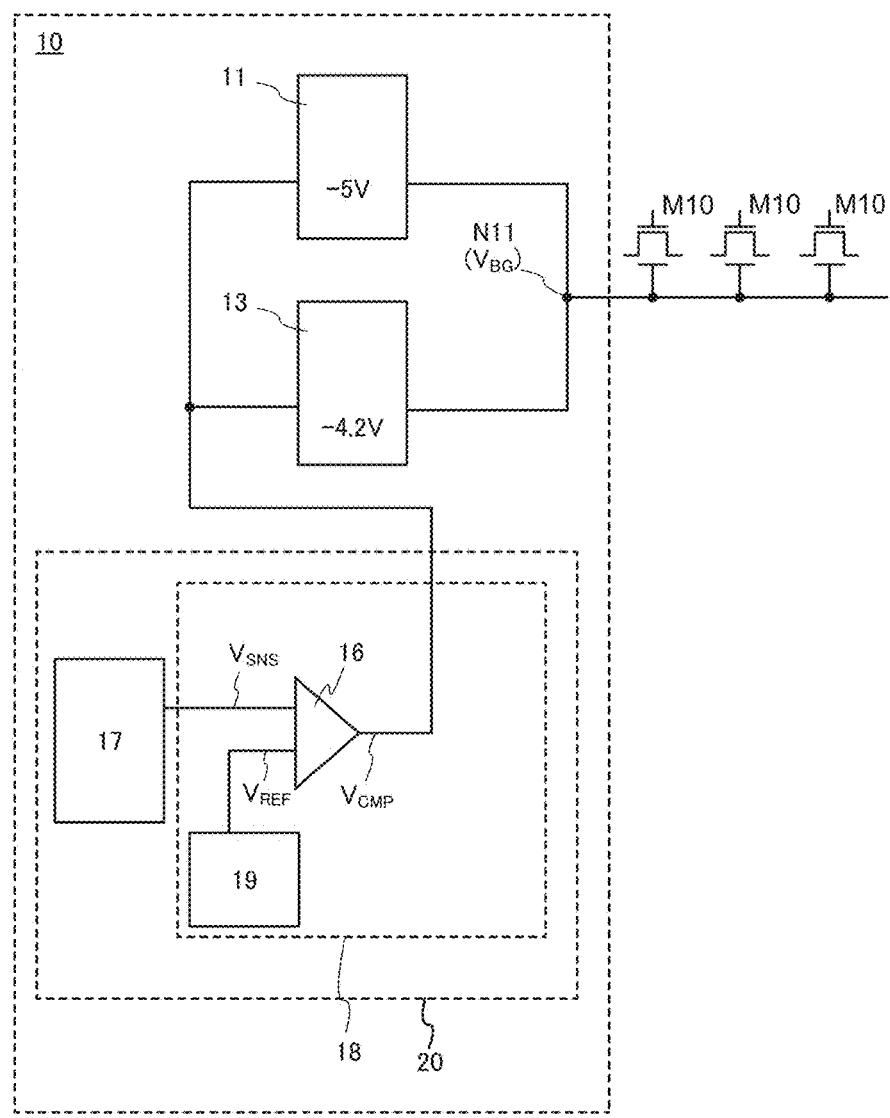
FIG. 5 is a circuit diagram illustrating a structure example of a semiconductor device.

The semiconductor device 10 may have a structure that does not include the voltage holding circuit 12; the voltage generated by the voltage generation circuit may be applied directly to the second gate of each of the transistors M10. FIG. 5 is a circuit diagram of the structure.

In FIG. 5, a voltage generation circuit 13 is provided in addition to the voltage generation circuit 11. The voltage generation circuit 13 generates a voltage higher than a voltage generated by the voltage generation circuit 11. For example, the voltage generation circuit 11 generates a voltage of −5 V, and the voltage generation circuit 13 generates a high voltage (e.g., −4.2 V).

The comparator 16 is electrically connected to the voltage generation circuit 11 and the voltage generation circuit 13. The voltage generation circuit 11 and the voltage generation circuit 13 perform output of voltage and stop output of voltage depending on $V_{CMP}$. For example, when $V_{CMP}$ is at L level, the voltage generation circuit 11 performs output and the voltage generation circuit 13 stops output. As a result, a voltage of −5 V is supplied as $V_{BG}$. When $V_{CMP}$ is at H level, the voltage generation circuit 13 performs output and the voltage generation circuit 11 stops output. As a result, a voltage of −4.2 V is supplied as $V_{BG}$. That is, one of the voltage generation circuit 11 and the voltage generation circuit 13 is selected depending on $V_{CMP}$.

Note that a switch may be provided between the voltage generation circuit 11 and the node N11 and also between the voltage generation circuit 13 and the node N11 so that one of the voltage generation circuits is selected by turning the switches on and off depending on $V_{CMP}$.

Figure 6:
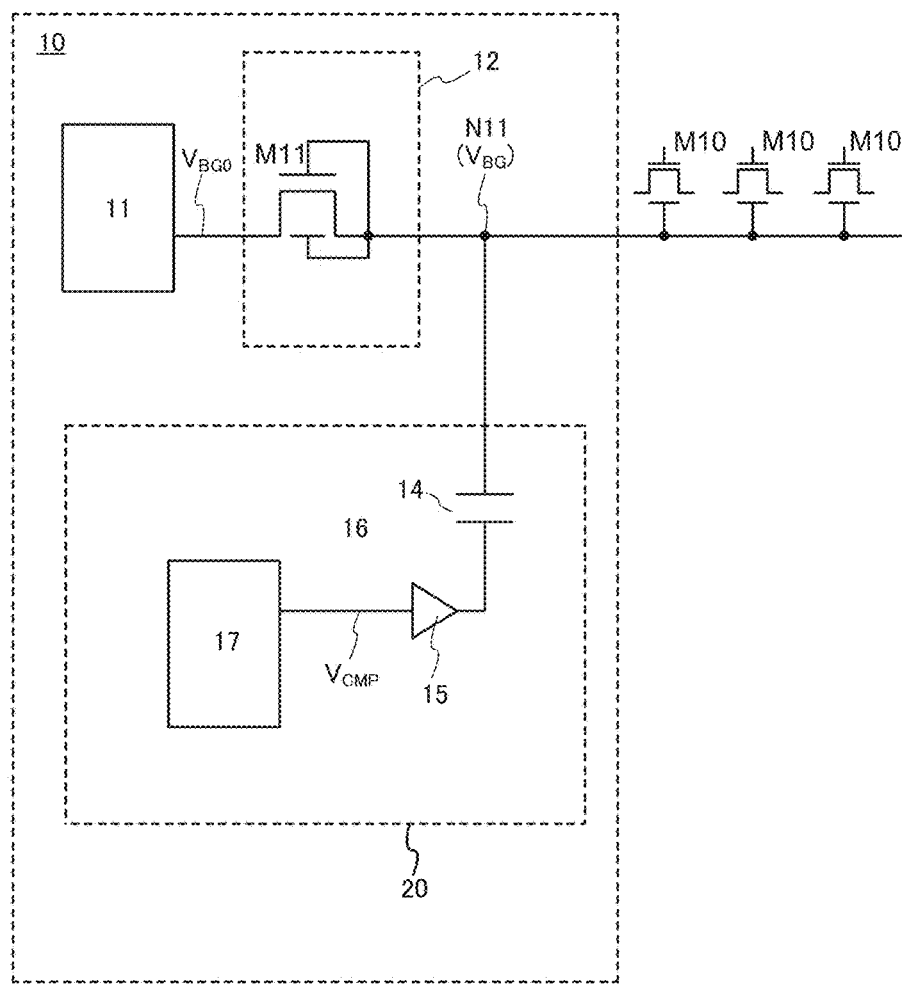
FIG. 6 is a circuit diagram illustrating a structure example of a semiconductor device.

The voltage control circuit 18 may be included in the temperature sensor 17. FIG. 6 shows a circuit diagram in that case. In FIG. 6, the temperature sensor 17 can output $V_{CMP}$ directly.

As described above, a semiconductor device with high on-state current can be provided using the semiconductor device 10 in this embodiment. A semiconductor device which can operate at high speed can be provided. A semiconductor device capable of holding data for a long time can be provided. A semiconductor device with low power consumption can be provided.

(Embodiment 2)

In this embodiment, a memory device including the semiconductor device 10 described in Embodiment 1 is described.

<<Memory Device 100>>

Figure 7:
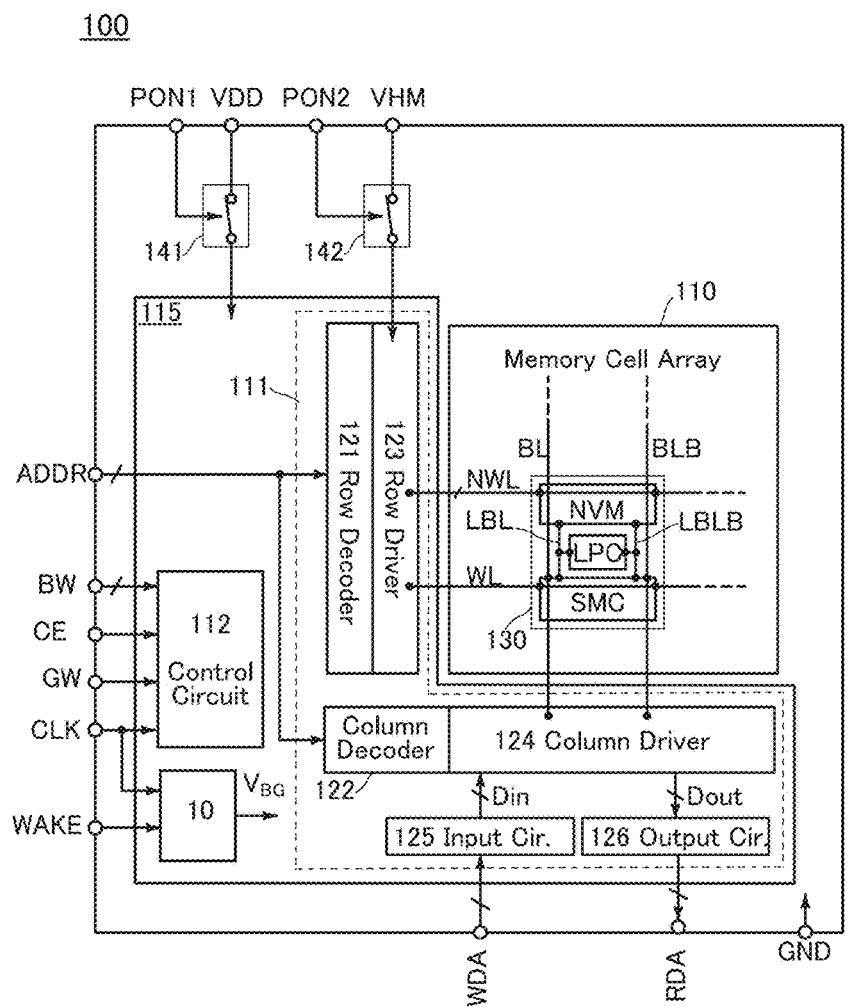
FIG. 7 is a block diagram illustrating a structure example of a memory device.

FIG. 7 is a block diagram showing a structure example of a memory device. A memory device 100 shown in FIG. 7 includes a memory cell array 110, a peripheral circuit 111, a control circuit 112, the semiconductor device 10, and power switches (PSW) 141 and 142.

The decision whether each circuit, each signal, and each voltage are used in the memory device 100 or not can be made as appropriate as needed. Another circuit or another signal may further be used. Signals BW, CE, GW, CLK, WAKE, ADDR, WDA, PON1, and PON2 are signals input from the outside. A signal RDA is a signal output to the outside. The signal CLK is a clock signal. The signals CE, GW, and BW are control signals. The signal CE is a chip enable signal. The signal GW is a global write enable signal. The signal BW is a byte write enable signal. The signal ADDR is an address signal. The signal WDA is write data, and the signal RDA is read data. The signals PON1 and PON2 are power gating control signals. Note that the signals PON1 and PON2 may be generated in the control circuit 112.

The control circuit 112 is a logic circuit having a function of controlling the entire operation of the memory device 100. For example, the control circuit performs a logical operation on the signals CE, GW, and BW to determine an operation mode of the memory device 100 (e.g., a write operation or a read operation). The control circuit 112 generates a control signal for the peripheral circuit 111 so that the operation mode is executed.

The memory cell array 110 includes a plurality of memory cells (MC) 130 and a plurality of wirings WL, NWL, BL, and BLB. The plurality of memory cells 130 are arranged in a matrix.

The memory cells 130 that are arranged in a row are electrically connected to the wirings WL and NWL in the row. The wirings WL and NWL are each a word line, and the wirings BL and BLB are a bit line pair for transmitting complementary data. The wiring BLB is a bit line to which data whose logic is inverted from that of data of the wiring BL, and the wiring BLB is also referred to as a complementary bit line or an inverted bit line. The memory cell 130 includes two kinds of memories, a memory SMC and a memory NVM. The SMC is a memory circuit capable of storing 1-bit complementary data. The NVM is a memory circuit capable of storing n-bit (n is an integer greater than 1) complementary data and can hold data for a long period of time even in a power-off state.

The semiconductor device 10 has a function of generating and holding a negative voltage ($V_{BG}$). The voltage $V_{BG}$ is applied to a transistor used in the NVM. The WAKE has a function of controlling the input of the CLK to the semiconductor device 10. For example, when a H-level signal is supplied to the WAKE, the signal CLK is input to the semiconductor device 10 and the voltage $V_{BG}$ is generated from the semiconductor device 10. For the details of the semiconductor device 10, the description of Embodiment 1 may be referred to.

The SMC and the NVM are electrically connected to each other through a local bit line pair (wirings LBL and LBLB). The wiring LBL is a local bit line with respect to the wiring BL, and the wiring LBLB is a local bit line with respect to the wiring BLB. The SMC and the NVM are electrically connected to each other through the wirings LBL and LBLB. The memory cell 130 includes a circuit LPC. The LPC is a local precharge circuit for precharging the wiring LBL and the wiring LBLB. A control signal of the LPC is generated in the peripheral circuit 111.

The peripheral circuit 111 is a circuit for writing and reading data to/from the memory cell array 110. The peripheral circuit 111 has a function of driving the wirings WL, NWL, BL and BLB. The peripheral circuit 111 includes a row decoder 121, a column decoder 122, a row driver 123, a column driver 124, an input circuit 125, and an output circuit 126.

The row decoder 121 and the column decoder 122 have a function of decoding the signal ADDR. The row decoder 121 is a circuit for specifying a row to be accessed. The column decoder 122 is a circuit for specifying a column to be accessed. The row driver 123 has a function of selecting the wirings WL and NWL in the row specified by the row decoder 121. Specifically, the row driver 123 has a function of generating a signal for selecting the wirings WL and NWL. The column driver 124 has a function of writing data to the memory cell array 110, reading data from the memory cell array 110, holding the read data, and precharging the wirings BL and BLB, for example.

The input circuit 125 has a function of holding the signal WDA. Data held by the input circuit 125 is output to the column driver 124. Data output from the input circuit 125 is written to the memory cell array 110. Data (Dout) read from the memory cell array 110 by the column driver 124 is output to the output circuit 126. The output circuit 126 has a function of holding Dout. The output circuit 126 outputs the held data to the outside of the memory device 100. The output data is the signal RDA.

The PSW 141 has a function of controlling the supply of VDD to a circuit other than the memory cell array 110, i.e., to a peripheral circuit 115. The PSW 142 has a function of controlling the supply of VHM to the row driver 123. In the memory device 100, a high power supply voltage is VDD and a low power supply voltage is GND (ground potential). The VHM, which is a high power supply voltage used for setting the wiring NWL to a high level, is higher than VDD. The on/off of the PSW 141 is controlled by the signal PON1, and the on/off of the PSW 142 is controlled by the signal PON2. The number of power domains to which VDD is supplied is one in the peripheral circuit 115 shown in FIG. 7. However, the number of power domains to which VDD is supplied can be two or more, in which case a power switch is provided for each power domain.

<<Memory Cell 130>>

Figure 8:
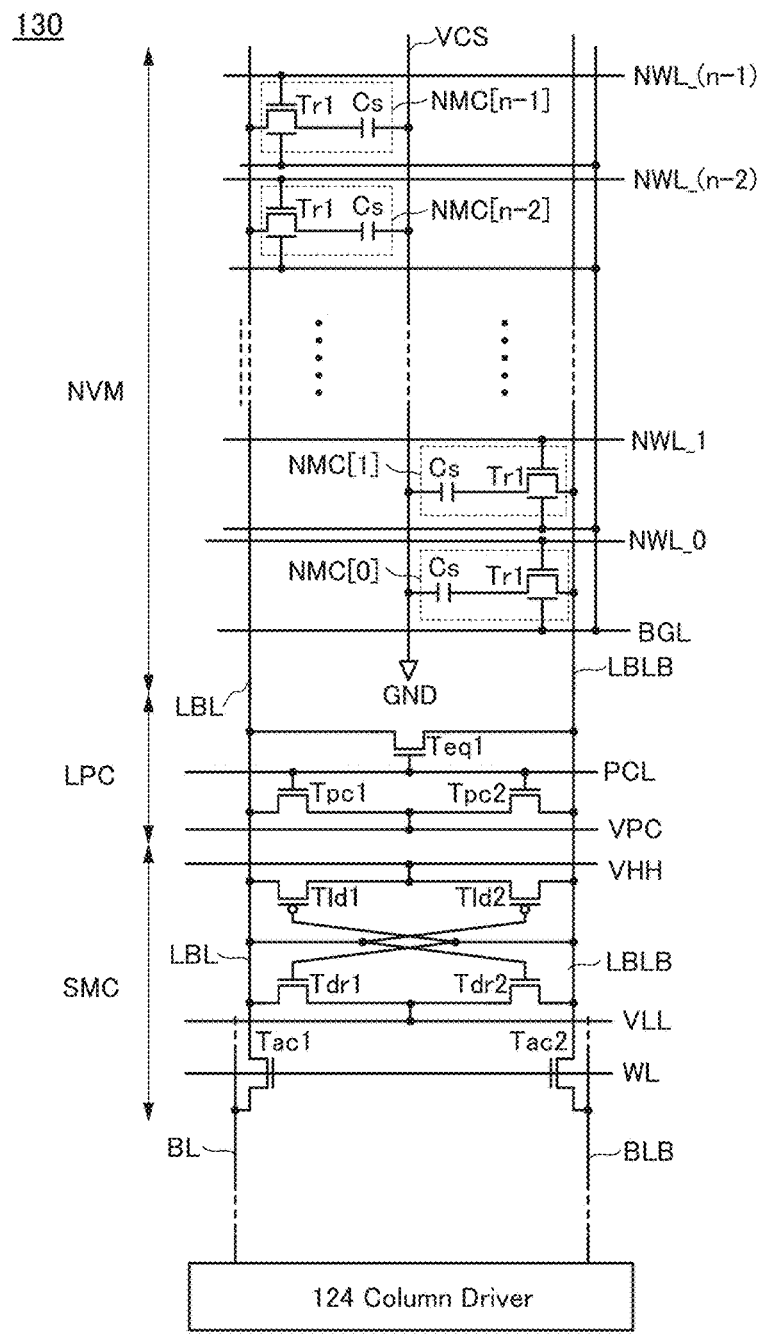
FIG. 8 is a circuit diagram illustrating a structure example of a memory cell.

FIG. 8 illustrates a circuit structure example of the memory cell 130.

<SMC>

The SMC is electrically connected to the wiring BL, the wiring BLB, the wiring LBL, the wiring LBLB, a wiring VHH, and a wiring VLL.

The SMC has a circuit structure similar to that of a CMOS (6-transistor type) SRAM cell and includes transistors Tld1, Tld2, Tdr1, Tdr2, Tac1, and Tac2. The transistors Tld1 and Tld2 are load transistors (pull-up transistors). The transistors Tdr1 and Tdr2 are driving transistors (pull-down transistors). The transistors Tac1 and Tac2 are access transistors (transfer transistors).

By the transistor Tac1, electrical continuity between the wiring BL and the wiring LBL is controlled. By the transistor Tac2, electrical continuity between the wiring BLB and the wiring LBLB is controlled. The on/off of the transistors Tac1 and Tac2 is controlled by the potential of the wiring WL. The transistors Tld1 and Tdr1 form an inverter, and the transistors Tld2 and Tdr2 form an inverter. An input terminal of one of the two inverters is electrically connected to an output terminal of the other inverter, and an output terminal of one of the two inverters is electrically connected to an input terminal of the other inverter, whereby a latch circuit is formed. A power supply voltage is supplied to the two inverters through the wirings VHH and VLL.

<NVM>

The NVM shown in FIG. 8 includes n (n is an even number greater than or equal to 2) memory circuits NMC. The n memory circuits NMC are electrically connected to different wirings NWL. Furthermore, the n memory circuits NMC are electrically connected to one wiring VCS. To distinguish the n memory circuits NMC from each other, signs such as [0] and [1] are used. To distinguish the n wirings NWL from each other, signs such as _0 and _1 are used.

The memory circuit NMC is a memory circuit (also referred to as a memory cell) capable of holding 1-bit data. The memory circuit NMC has a circuit structure similar to that of a 1-transistor 1-capacitor type dynamic random access memory (DRAM) memory cell. The memory circuit NMC includes a transistor Tr1 and a capacitor Cs. The capacitor Cs functions as a storage capacitor of the memory circuit NMC. The wiring VCS is a power supply line for the storage capacitor of the memory circuit NMC, and GND is input here.

A gate (a first gate) of the transistor Tr1 is electrically connected to the wiring NWL. One of a source and a drain of the transistor Tr1 is electrically connected to the wiring LBL (or the wiring LBLB). A first terminal of the capacitor Cs is electrically connected to the other of the source and the drain of the transistor Tr1, and a second terminal of the capacitor Cs is electrically connected to the wiring VCS.

The transistor Tr1 includes a second gate. The second gate of the transistor Tr1 is electrically connected to a wiring BGL. The wiring BGL is a signal line to which a signal for controlling the potential of the second gate of the transistor Tr1 is input, or a power supply line to which a fixed potential is input. The threshold voltage of the transistor Tr1 can be controlled by the potential of the wiring BGL. Thus, the transistor Tr1 can be prevented from being normally on.

Half of the memory circuits NMC[0] to NMC[n−1] are connected to the wiring LBL, and the other half of the memory circuits NMC[0] to NMC[n−1] are connected to the wiring LBLB. The NVM in FIG. 8 shows a circuit diagram in which a folded architecture is used as the layout of the memory cell. Note that a memory cell with a folded architecture is described below using FIG. 11.

The OS transistor is preferably used as the transistor Tr1. Using the OS transistor can extremely reduce the off-state current of the transistor Tr1.

Reducing the off-state current of the transistor Tr1 can increase the holding time of the memory circuit NMC. An ultralow off-state current means that, for example, an off-state current per micrometer of channel width is lower than or equal to 100 zA (zeptoamperes). Since the off-state current is preferably as low as possible, the normalized off-state current is preferably lower than or equal to 10 zA/μm or lower than or equal to 1 zA/μm, and further preferably lower than or equal to 10 yA/μm (yA: yoctoamperes). Note that 1 zA is $1 \times 10^{-21}$ A and 1 yA is $1 \times 10^{-24}$ A.

When the OS transistor is used as the transistor Tr1, the holding time of the memory circuit NMC can be increased, and the memory circuit NMC can be used as a nonvolatile memory circuit.

Note that the number of memory circuits NMC (n) is preferably a multiple of 8. That is, the number of bits of data that can be held by the NVM is preferably a multiple of 8. When the number of memory circuits NMC is equal to a multiple of 8, the memory cell 130 can handle data in units, for example, in byte (8-bit) units, word (32-bit) units, or half word (16-bit) units.

<LPC>

The LPC is electrically connected to a wiring PCL and a wiring VPC. The wiring PCL is a signal line for supplying a signal for controlling the precharge operation of the wirings LBL and LBLB. The wiring VPC is a power supply line for supplying a precharge voltage. The LPC includes transistors Teq1, Tpc1, and Tpc2. Gates of the transistors Teq1, Tpc1, and Tpc2 are electrically connected to the wiring PCL. The transistor Teq1 controls the electrical continuity between the wirings LBL and LBLB. The transistor Tpc1 controls the electrical continuity between the wirings LBL and VPC. The transistor Tpc2 controls the electrical continuity between the wirings LBLB and VPC.

The transistors Teq1, Tpc1, and Tpc2 are n-channel transistors in the example shown in FIG. 8, but they may be p-channel transistors. Furthermore, the transistor Teq1 need not be necessarily provided in the LPC. In that case, each of the transistors Tpc1 and Tpc2 may be either an n-channel transistor or a p-channel transistor. The LPC may be constituted by only the transistor Teq1. Also in that case, the transistor Teq1 may be either an n-channel transistor or a p-channel transistor. The LPC that is constituted by the transistor Teq1 precharges the wirings LBL and LBLB by smoothing the potentials of the wiring LBL and the wiring LBLB.

The peripheral circuit 111 has a function of supplying a potential to power supply lines (the wirings VHH, VLL, and VPC) provided in the memory cell array 110. Therefore, when the PSW 141 is turned off and the supply of VDD to the peripheral circuit 111 is stopped, the supply of a potential to these power supply lines is also stopped.

<<Operation Example of Memory Device 100>>

Figure 9:
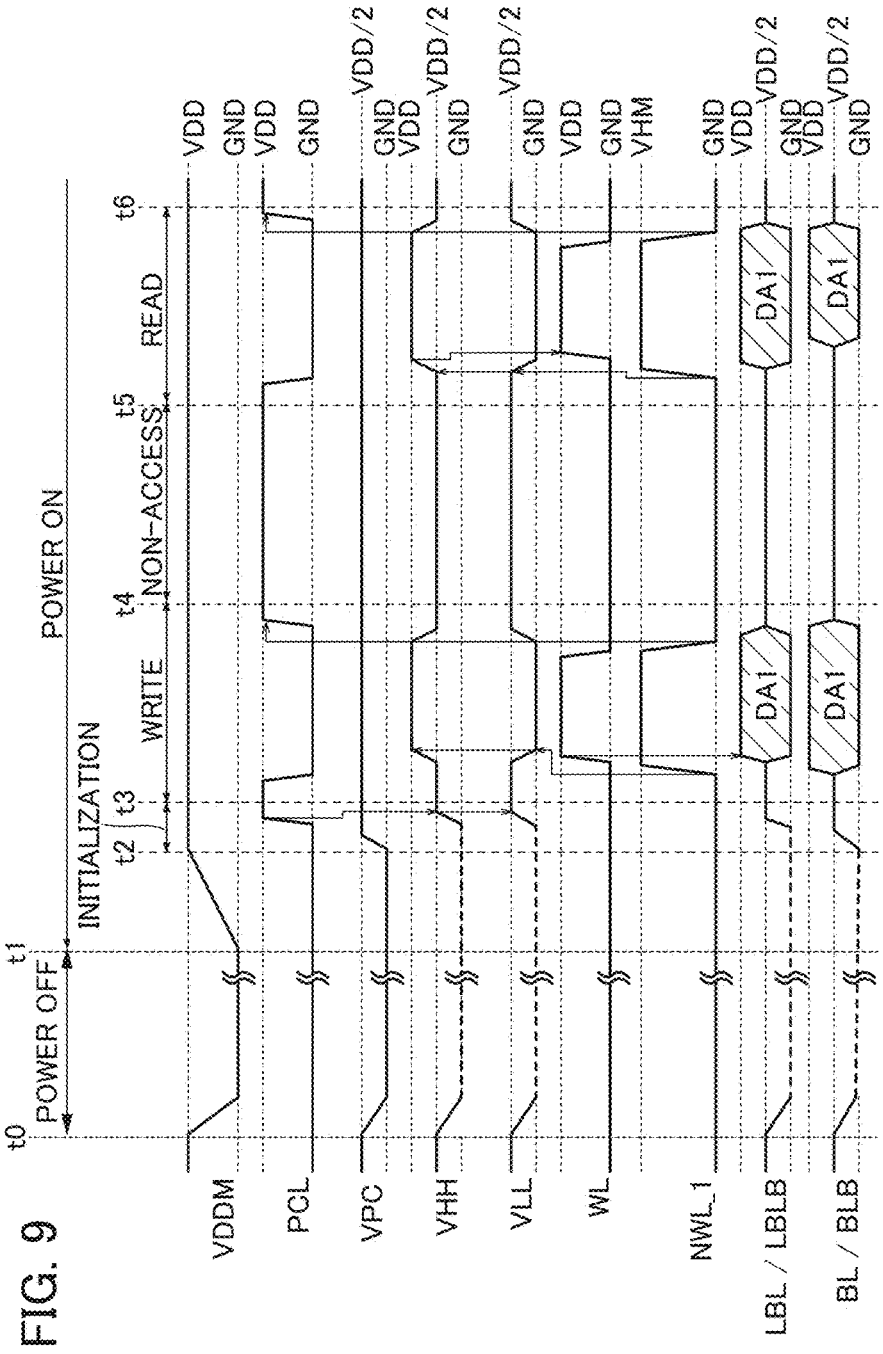
FIG. 9 is a timing chart illustrating an operation example of a semiconductor device.

An operation example of the memory device 100 is described using a timing chart shown in FIG. 9. For the data read operation, a method is employed in which one of the memory circuits NMC in the NVM is selected, data of the selected memory circuit NMC is amplified by the SMC, and the amplified data is written to the wirings BL and BLB.

In FIG. 9, t0, t1, and the like each represent time. An arrow is provided between waveforms for easy understanding of the operation of the memory device 100. VDDM represents a power supply line for VDD supply that is provided in the memory device 100. The supply of VDD to the VDDM is controlled by the PSW 141. In waveforms in FIG. 9, dotted lines show that the potentials are uncertain. The low level (L level) of each of the wiring VDDM and the like is GND. In the signal lines, the high level (H level) of each of the wirings PCL and WL is VDD, and the high level of each of the wirings NWL_0 to NWL_[n−1] is VHM.

Note that the reason why the high level of each of the wirings NWL_0 to NWL_[n−1] is VHM is that the threshold voltage of the transistor Tr1 is assumed to be higher than the threshold voltages of the other transistors such as the transistor Tac1. In the case where data can be written to/from the NVM by applying VDD to the wirings NWL_0 to NWL_[n−1], the high level of the wirings NWL_0 to NWL_[n−1] can be set to VDD. In that case, the PSW 142 for the VHM is not necessarily provided in the memory device 100 (see FIG. 7).

(Power Gating)

First, the power gating operation of the memory device 100 is described. In a period t0-t1, the memory device 100 is in a power-off state in which the supply of VDD is stopped. After t1, the memory device 100 is in a power-on state in which VDD is supplied.

By turning off the PSW 141 at t0, the potential of the VDDM is decreased to GND. The potentials of the wirings WL, NWL_0 to NWL_[n−1], PCL, and VPC are also at GND because the supply of VDD to the peripheral circuit 111 is stopped. By turning on the PSW 141 at t1, the VDDM is charged, and the potential of the VDDM is increased to VDD. A period t1-t2 is a time required for power supply resumption. The PSW 142 may be turned on or off in conjunction with turning on or off of the PSW 141.

(Initialization)

In a period t2-t3, an initialization operation for bringing the memory device 100 into an initial state is performed. Specifically, the VPC, the VHH, and the VLL are set to VDD/2. The bit line pair (BL and BLB) and the local bit line pair (LBL and LBLB) are each precharged to VDD/2. The precharging of the bit line pair is performed by the column driver 124, and the precharging of the local bit line pair is performed by the LPC. By setting the wiring PCL to a high level (H level), the transistors Teq1, Tpc1, and Tpc2 are turned on, and precharging of the LBL and the LBLB and smoothing of the potentials of the LBL and the LBLB are performed.

(Writing)

With write access, the state of the bit line pair is changed from a precharge state to a floating state by the column driver 124. Furthermore, the state of the local bit line pair is changed from a precharge state to a floating state by the LPC. This is achieved by changing the level of the wiring PCL from H level to L level.

Then, data DA1 is written to the bit line pair by the column driver 124. When the BL is at VDD, the BLB is at GND. At the time when a row address is decoded by the row decoder 121, one of the wirings NWL_0 to NWL_[n−1] in a write target row is set to H level. The wiring NWL_1 is set to H level here to turn on the transistor Tr1 in the memory circuit NMC[1]. After the wiring NWL_1 is selected, the VHH is set to VDD and the VLL is set to GND, whereby the SMC is made active. Furthermore, after the wiring NWL_1 is selected, a wiring WL in the write target row is set to H level to turn on the transistors Tac1 and Tac2. Note that the wiring WL may be set to H level at the time when the wiring NWL_1 is set to H level.

By turning on the transistors Tac1 and Tac2, the data DA1 is written to the local bit line pair. At this time, the data DA1 is written to the SMC because the SMC is active. In addition, the data DA1 is written also to the memory circuit NMC[1] because the transistor Tr1 in the memory circuit NMC[1] in the write target row in the NVM is on. The WL is kept at H level for a given period, and then, the WL is set to L level. By setting the WL to L level, a non-conduction state is brought about between the SMC and the bit line pair. After the state is brought about, the wiring NWL_1 is set to L level so that the memory circuit NMC[1] is returned to a non-selected state. After the wiring NWL_1 is set to L level, the potentials of the VHH and VLL are returned to VDD/2, and the SMC is made inactive. Although the data DA1 is lost from the SMC with the inactive SMC, the data loss does not become a problem because the data DA1 can be held in the memory circuit NMC[1] for a long time.

After the wiring NWL_1 is set to L level, the precharge operation of the bit line pair and the local bit line pair is started, and the bit line pair and the local bit line pair are precharged to VDD/2.

(Non-Access)

In a period t4-t5, the memory device 100 is in a non-access state where access is not requested from a host device. The wiring PCL is at H level, and the wirings WL and NWL_0 to NWL_[n−1] are at L level. The VPC, the VHH, and the VLL are at VDD/2. The bit line pair and the local bit line pair are precharged to VDD/2. The VHH and the VLL are kept at VDD/2 because the SMC need not be operated in the period t4-t5, whereby the leakage current of the SMC can be reduced. Consequently, power consumption of the whole memory device 100 can be effectively decreased.

(Reading)

In a period t5-t6, the memory device 100 performs an operation in accordance with a request for a read access from the host device. It is assumed here that data required for processing of the host device is stored in the memory circuit NMC[1] in the NVM.

With read access, the state of the bit line pair is changed from a precharge state to a floating state by the column driver 124, and the state of the local bit line pair is changed from a precharge state to a floating state by the LPC. Then, the wiring NWL_1 is set to H level to turn on the transistor Tr1 in the memory circuit NMC[1]. The data DA1 is written to the local bit line pair. After the wiring NWL_1 is set to H level, the VHH is set to VDD and the VLL is set to GND, whereby the SMC is made active. At this time, the SMC functions as a differential amplifier circuit and amplifies the data DA1 of the local bit line pair. After the SMC is made active, the WL is set to H level and the data DA1 of the local bit line pair is written to the bit line pair. The data DA1 written to the bit line pair is read by the column driver 124.

The finishing operation of the read operation is similar to the case of the write operation; that is, the initialization operation and the operation for bringing about a non-access state are performed. First, the WL is set to L level. Then, the wiring NWL_1 is set to L level. Then, the VHH and the VLL are set to VDD/2, whereby the SMC is made inactive. After the wiring NWL_1 is set to L level, precharging of the bit line pair and the local bit line pair is started.

In the example shown in FIG. 9, the precharging of the local bit line pair is started at the end of the write operation and the read operation by setting the PCL to H level, but one embodiment of the present invention is not limited to the example shown in FIG. 9. The precharging of the local bit line pair may be started between the time at which the wiring NWL_1 is set to L level and the time at which the WL is set to H level by setting the PCL to H level.

Although the potential of the local bit line pair is fixed to VDD/2 by keeping the PCL at H level in the non-access state in the example shown in FIG. 9, the local bit line pair may remain in a floating state by setting the PCL to L level. In that case, the level of the PCL is changed from L level to H level at the start of the write operation and the read operation, and then, the local bit line pair is precharged.

<<Device Structure of Memory Cell Array>>

Figure 10:
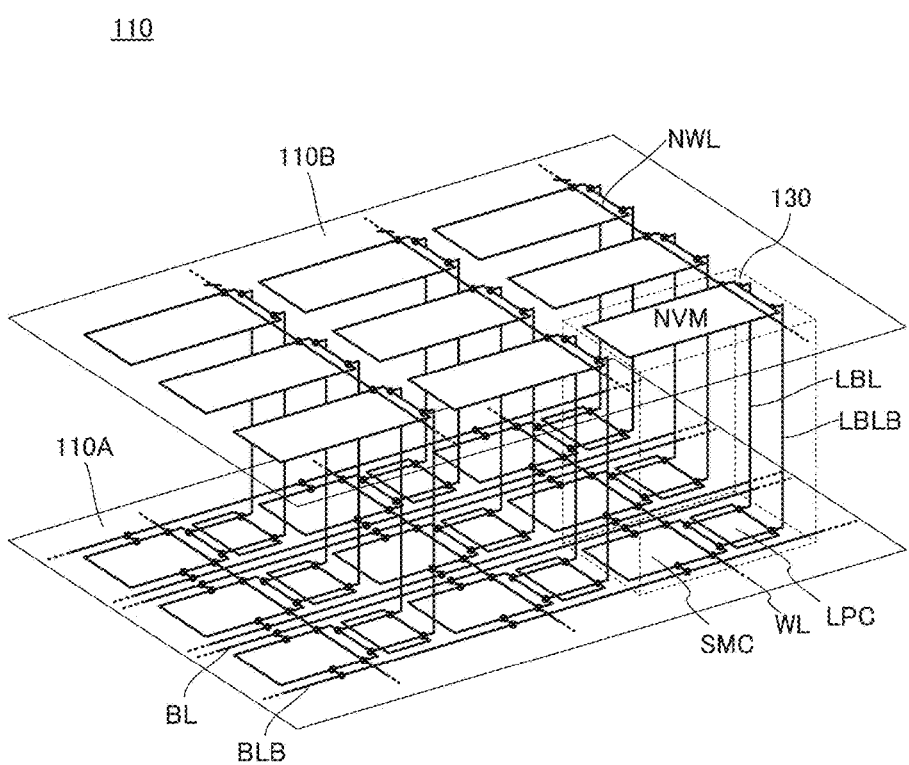
FIG. 10 is a block diagram illustrating a structure example of a memory cell array.

In the memory device 100, an OS transistor can be used as the transistor Tr1 in the NVM, and Si transistors can be used as the other transistors, for example. In that case, the memory cell array 110 can have a device structure in which a circuit including an OS transistor is stacked over a circuit including a Si transistor. FIG. 10 schematically shows an example of a device structure of the memory cell array 110.

<Memory Cell Array>

In the example shown in FIG. 10, a memory cell array 110B is stacked over a memory cell array 110A. In the memory cell array 110A, SMCs and LPCs are arranged in a matrix. In the memory cell array 110B, NVMs are arranged in a matrix. In the memory cell array 110A, a memory portion A with a high response speed is formed. In the memory cell array 110B, a memory portion B for long-term data storage is formed. By stacking the memory cell array 110B over the memory cell array 110A, the memory device 100 can achieve a high capacitance and a small size effectively.

Stacking of the memory cell array 110B over the memory cell array 110A achieves a high capacitance and a small size of the memory cell array 110. The area of the memory cell 130 per bit can be reduced compared with the area of a memory cell per bit in a CMOS SRAM memory cell.

The memory cell array 110B including the NVMs is highly compatible with a CMOS circuit compared with other nonvolatile memories such as a flash memory, a magnetoresistive random access memory (MRAM), and a phase change random access memory (PRAM). A flash memory requires a high voltage for driving. An MRAM and a PRAM are each a current-drive memory, and therefore, an element and a circuit for current drive are required. In contrast, the NVM is operated by controlling the on state and the off state of the transistor Tr1. That is, the NVM is a circuit including a voltage-drive transistor like a CMOS circuit and can be driven at a low voltage. Therefore, a processor and the memory device 100 can be easily incorporated in one chip. Furthermore, the area of the memory device 100 per bit can be reduced without performance degradation. Still furthermore, the power consumption of the memory device 100 can be reduced. Moreover, the memory device 100 can store data even in a power-off state, and thus, the power gating of the memory device 100 can be performed.

A SRAM is operated at high speed and therefore used in an on-chip cache memory of a standard processor. A SRAM has the following drawbacks: power is consumed even in a standby state, and it is difficult to increase the capacitance. For example, it is said that, in the case of a processor for application to a mobile device, the proportion of the power consumption of an on-chip cache memory in a standby state accounts for 80% of the average power consumption of the whole processor. In contrast, the memory device 100 is a RAM that has advantages of a SRAM, i.e., reading and writing at high speed, and does not have the drawbacks of a SRAM. Thus, the use of the memory device 100 in an on-chip cache memory is advantageous in reducing the power consumption of the whole processor. The area of the memory device 100 per bit is small and the capacitance can be increased easily; therefore, the memory device 100 is suitably used for a cache memory or the like.

Figure 11:
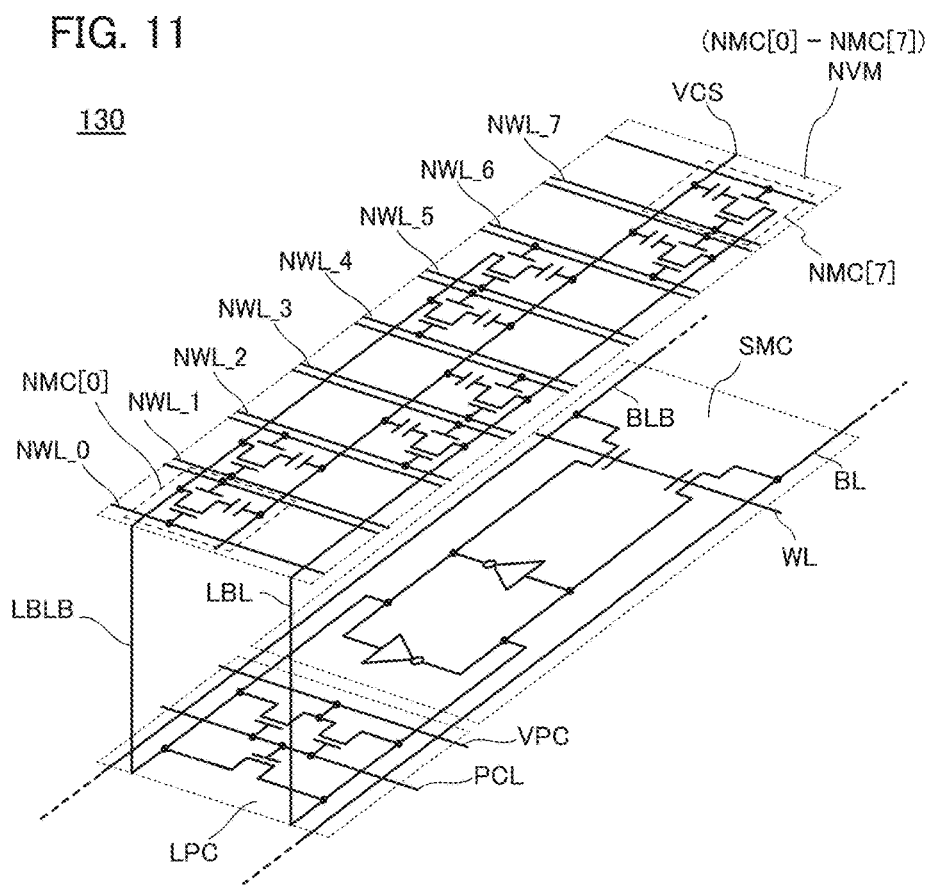
FIG. 11 is a circuit diagram illustrating a structure example of a memory cell.
Figure 12:
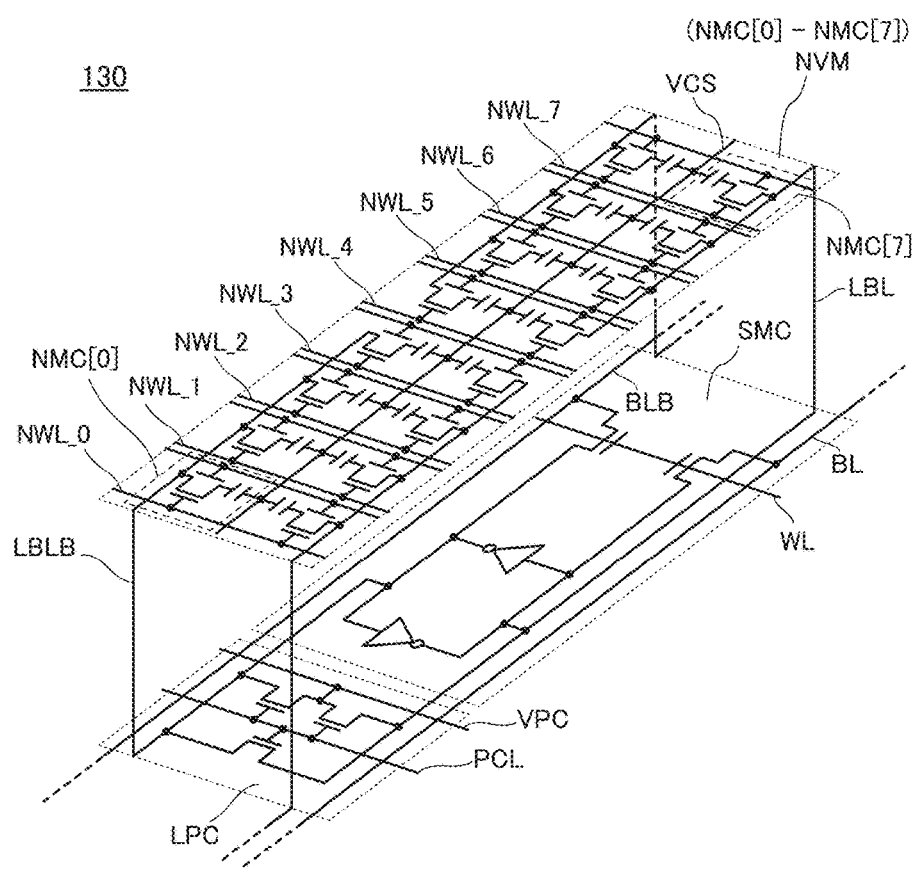
FIG. 12 is a circuit diagram illustrating a structure example of a memory cell.

Next, the layout of the NVM (a folded architecture, a twin cell architecture, and an open-type architecture) is described using FIG. 11 and FIG. 12. Note that FIG. 11 and FIG. 12 show examples of the NVM that stores 8-bit data (the NVM includes memory circuits NMC[0] to NMC[7]).

<Folded Architecture>

A circuit diagram shown in FIG. 11 shows an example in which a folded architecture is used as the layout of the memory cell 130. The memory circuits NMC[0] to NMC[7] are provided over a region where the SMC and the LPC are formed. In the memory cell 130 that has a folded architecture, some of the memory circuits NMC are connected to the wiring LBL, and the other of the memory circuits NMC are connected to the wiring LBLB. With the use of the folded architecture in the memory cell 130, noise that is output to the wiring LBL or the wiring LBLB can be reduced by a change in the potential of the wiring NWL.

<Open-Type Architecture>

A circuit diagram shown in FIG. 12 shows an example in which an open-type architecture is used as the layout of the memory cell 130. As in the case of the folded architecture, each of the memory circuits NMC includes one transistor and one capacitor. In the memory cell 130 that has an open-type architecture, some of the memory circuits NMC are connected to the wiring LBL, and the other of the memory circuits NMC are connected to the wiring LBLB. In FIG. 12, two memory circuits NMC appear to be connected to one wiring NWL, but one of the two memory circuits NMC is connected to an adjacent memory cell 130. With the use of the open-type architecture, the memory circuits NMC can be highly integrated, and the volume of data that can be stored in the memory device 100 can be increased compared with the case of using other layouts.

<Twin Cell Architecture>

Figure 13:
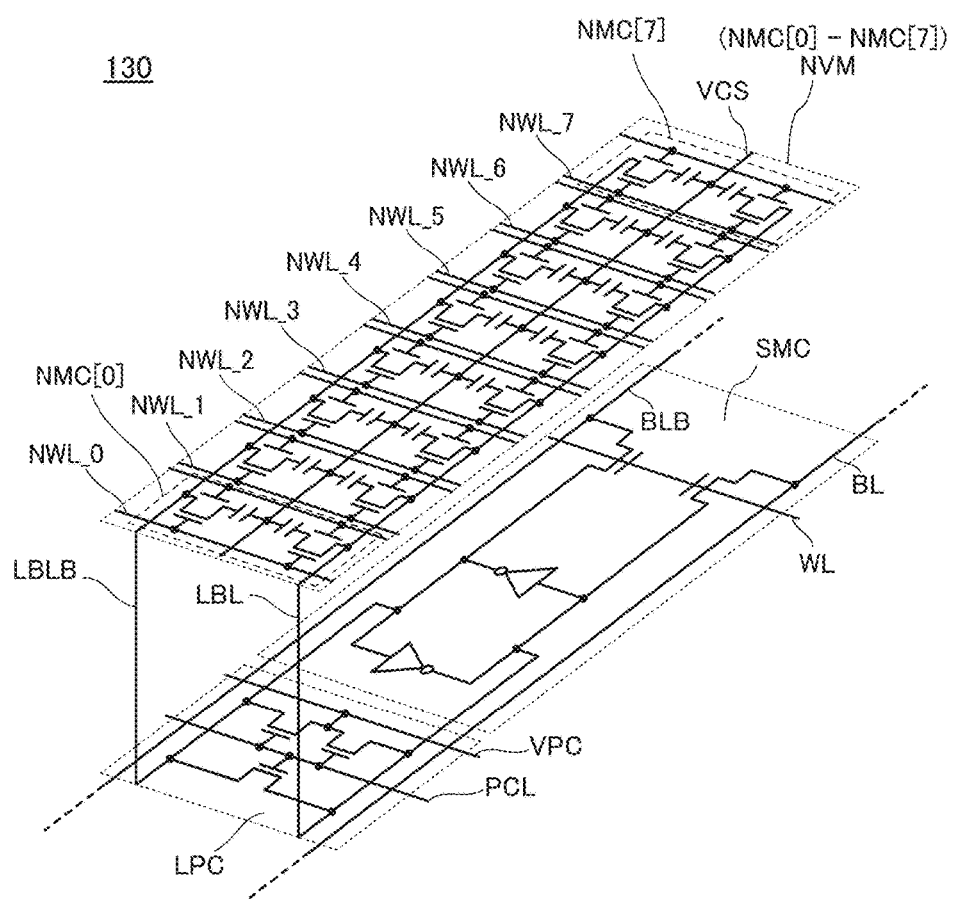
FIG. 13 is a circuit diagram illustrating a structure example of a memory cell.

A circuit diagram shown in FIG. 13 shows an example in which a twin cell architecture is used as the layout of the memory cell 130. In FIG. 13, each of the memory circuits NMC includes two transistors and two capacitors. That is, each of the memory circuits NMC includes two complementary memory cells. In the memory cell 130 that has a twin cell architecture, complementary data held in two memory cells is used as 1-bit data.

Owing to the pair of memory cells, the memory circuit NMC can hold complementary data for a long time. Since the complementary data is held in the memory circuit NMC, the SMC can function as a differential amplifier circuit at the time of reading the complementary data stored in the memory circuit NMC. Thus, with a twin cell architecture, a read operation can be performed with high reliability even when the voltage difference between the voltage held in one of the pair of memory cells and the voltage held in the other is small.

<Cross-Sectional View of Memory Device 100>

FIG. 14 illustrates an example of a cross-sectional view of the memory device 100. The memory device 100 in FIG. 14 includes a layer L1, a layer L2, a layer L3, and a layer L4 that are stacked in this order from the bottom.

The layer L1 includes a transistor M1, a substrate 300, an element isolation layer 301, an insulator 302, a plug 310, and the like.

The layer L2 includes an insulator 303, a wiring 320, an insulator 304, a plug 311, and the like.

Figure 19:
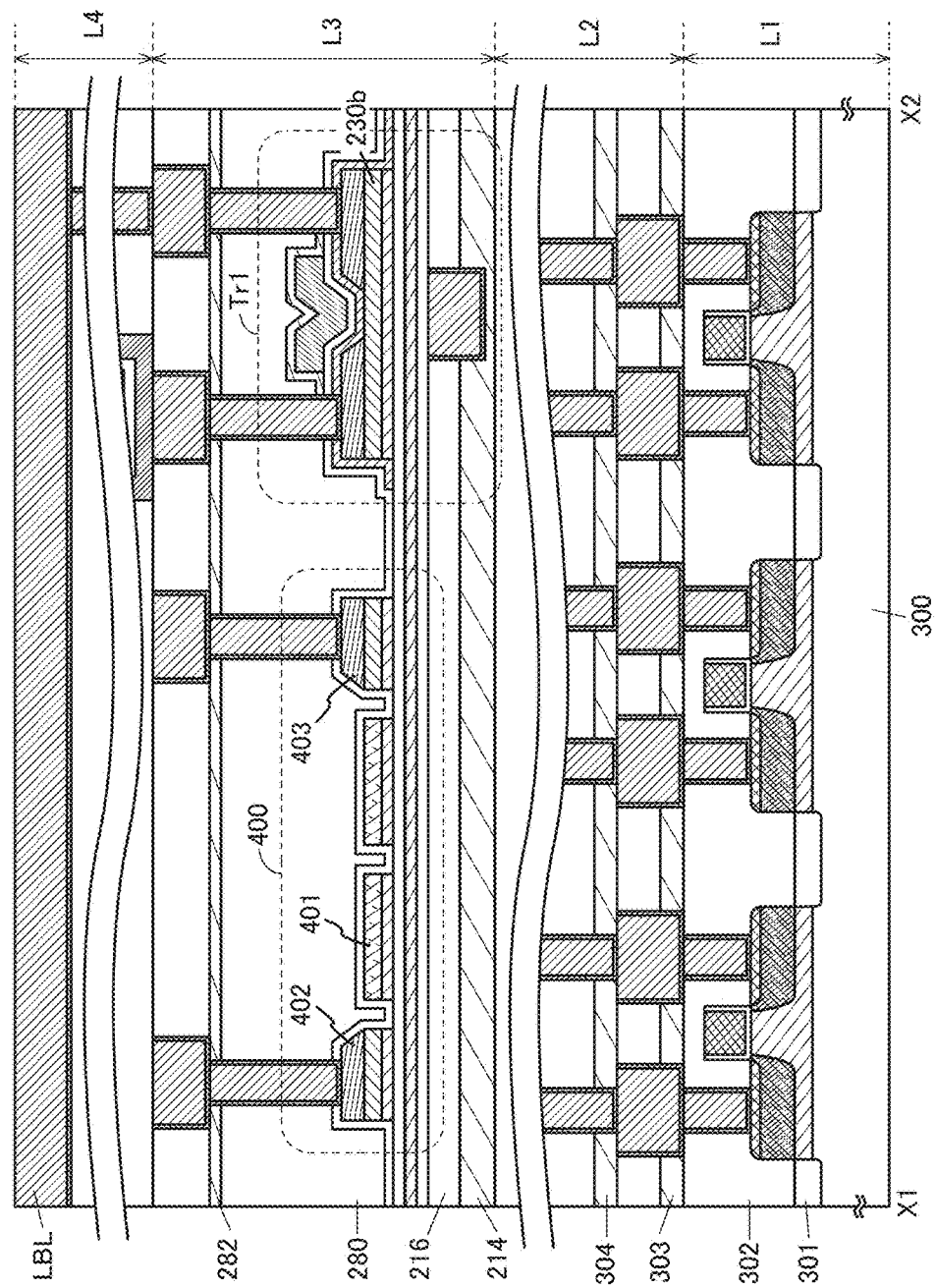
FIG. 19 is a cross-sectional view illustrating a structure example of a memory device including a resistor.

The layer L3 includes an insulator 214, an insulator 216, the transistor Tr1, a plug 312, an insulator 282, a wiring 321, and the like. The first gate of the transistor Tr1 functions as the wiring NWL, and the second gate of the transistor Tr1 functions as the wiring BGL. FIG. 19 illustrates an example in which an OS transistor is used as the transistor Tr1.

The layer L4 includes the capacitor Cs, a plug 313, the wiring LBL, and the like. The capacitor Cs is formed of a conductor 322, a conductor 323, and an insulator 305.

Next, the transistor M1 will be described in detail with reference to FIGS. 15A and 15B. A cross section of the transistor M1 in the channel length direction is shown on the left of FIG. 15A, and a cross section of the transistor M1 in the channel width direction is shown on the right of FIG. 15A.

The transistor M1 is provided over the substrate 300 and isolated from another adjacent transistor by the element isolation layer 301. For the element isolation layer 301, silicon oxide, silicon oxynitride, silicon nitride oxide, silicon nitride, or the like can be used. Note that in this specification, an oxynitride refers to a substance that contains more oxygen than nitrogen, and a nitride oxide refers to a substance that contains more nitrogen than oxygen.

As the substrate 300, a single crystal semiconductor substrate or a polycrystalline semiconductor substrate of silicon or silicon carbide, a compound semiconductor substrate of silicon germanium, a silicon-on-insulator (SOI) substrate, or the like can be used. Moreover, a glass substrate, a quartz substrate, a plastic substrate, a metal substrate, an attachment film, paper containing a fibrous material, or a base film, for example, may be used as the substrate 300. Alternatively, a semiconductor element may be formed using one substrate and then transferred to another substrate.

Further alternatively, a flexible substrate may be used as the substrate 300. Note that as a method for forming a transistor over a flexible substrate, there is also a method in which a transistor is formed over a non-flexible substrate and then is separated from the non-flexible substrate and transferred to the flexible substrate 300. In that case, a separation layer is preferably provided between the non-flexible substrate and the transistor. As the substrate 300, a sheet, a film, or a foil that contains a fiber may be used. The substrate 300 may have elasticity. The substrate 300 may have a property of returning to its original shape when bending or pulling is stopped; alternatively, the substrate 300 may have a property of not returning to its original shape. The thickness of the substrate 300 ranges, for example, from 5 μm to 700 μm, preferably from 10 μm to 500 μm, further preferably from 15 μm to 300 μm. When the substrate 300 has a small thickness, the weight of a semiconductor device can be reduced. Moreover, when the substrate 300 has a small thickness, even in the case of using glass or the like, the substrate 300 may have elasticity or a property of returning to its original shape after bending or pulling is stopped. Thus, an impact applied to a semiconductor device over the substrate 300, which is caused by dropping or the like, can be reduced. That is, a durable semiconductor device can be provided. When a flexible substrate is used as the substrate 300, a substrate of a metal, an alloy, resin, glass, or fiber thereof can be used, for example. The flexible substrate 300 preferably has a lower coefficient of linear expansion because deformation due to an environment is suppressed. The flexible substrate 300 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon and aramid), polyimide, polycarbonate, acrylic, and polytetrafluoroethylene (PTFE). In particular, aramid is preferably used for the flexible substrate 300 because of its low coefficient of linear expansion.

This embodiment shows an example where a single crystal silicon wafer is used as the substrate 300.

The transistor M1 includes a channel formation region 352 and impurity regions 353 and 354 provided in a well 351, conductive regions 355 and 356 in contact with the impurity regions 353 and 354, a gate insulator 358 over the channel formation region 352, and a gate electrode 357 over the gate insulator 358. Note that the conductive regions 355 and 356 may be formed using metal silicide or the like.

Figure 15A:
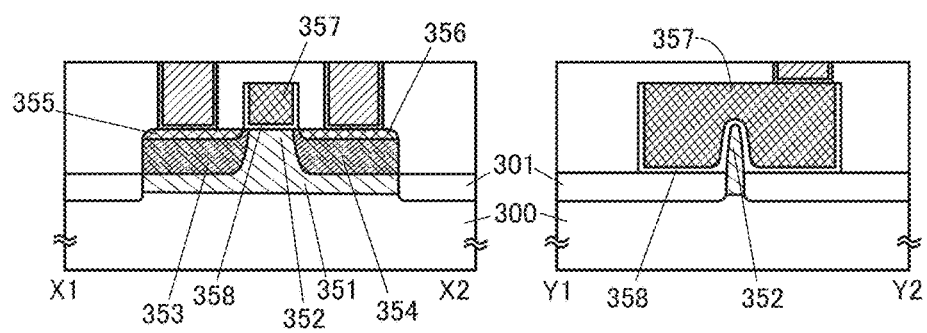
FIGS. 15A and 15B are cross-sectional views illustrating structure examples of a transistor.

In the transistor M1 in FIG. 15A, the channel formation region 352 has a projecting portion, and the gate insulator 358 and the gate electrode 357 are provided along side and top surfaces of the projecting portion. The transistor with such a shape is referred to as a FIN-type transistor. Although the projecting portion is formed by processing part of the semiconductor substrate in this embodiment, a semiconductor layer with a projecting portion may be formed by processing an SOI substrate.

This embodiment shows an example in which a Si transistor is used as the transistor M1. The transistor M1 may be either an n-channel transistor or a p-channel transistor; a transistor appropriate for an intended circuit is used.

Note that the transistor M1 may be a planar transistor. FIG. 15B shows an example of that case. A cross section of the transistor M1 in the channel length direction is shown on the left of FIG. 15B, and a cross section of the transistor M1 in the channel width direction is shown on the right of FIG. 15B.

Figure 15B:
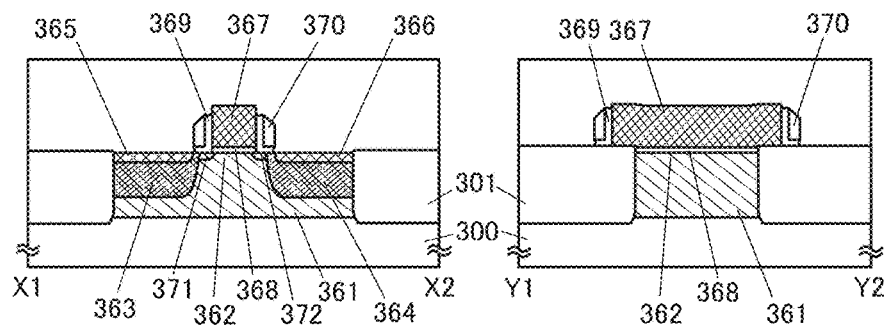

The transistor M1 illustrated in FIG. 15B includes a channel formation region 362, low-concentration impurity regions 371 and 372, and high-concentration impurity regions 363 and 364 provided in a well 361; conductive regions 365 and 366 in contact with the high-concentration impurity regions 363 and 364; a gate insulator 368 over the channel formation region 362; a gate electrode 367 over the gate insulator 368; and sidewall insulating layers 369 and 370 provided on sidewalls of the gate electrode 367. Note that the conductive regions 365 and 366 may be formed using metal silicide or the like.

FIG. 14 is described again. The insulator 302 serves as an interlayer insulator. In the case where a Si transistor is used as the transistor M1, the insulator 302 preferably contains hydrogen. When the insulator 302 contains hydrogen, dangling bonds of silicon can be terminated and thus the reliability of the transistor M1 can be improved. For the insulator 302, silicon oxide, silicon oxynitride, silicon nitride oxide, silicon nitride, or the like is preferably used.

The insulator 303 is preferably formed using, for example, a barrier film that prevents hydrogen or impurities from diffusing from the substrate 300, the transistor M1, or the like into a region where the transistor Tr1 is formed. For example, silicon nitride formed by a CVD method can be used. Diffusion of hydrogen into a metal oxide contained in the transistor Tr1 degrades the characteristics of the metal oxide in some cases. Therefore, a film that prevents hydrogen diffusion is preferably provided between the transistor M1 and the transistor Tr1.

The film that prevents hydrogen diffusion means a film from which hydrogen is unlikely to be released. The amount of released hydrogen can be measured by thermal desorption spectroscopy (TDS), for example. The amount of hydrogen released from the insulator 303 that is converted into hydrogen atoms per area of the insulator 303 is less than or equal to $10\times10^{15}$ atoms/cm$^2$, preferably less than or equal to $5\times10^{15}$ atoms/cm$^2$ in TDS analysis in the range of 50° C. to 500° C., for example.

For the insulators 304, 214, and 282, an insulator that inhibits copper diffusion or an insulator with barrier properties against oxygen and hydrogen is preferably used. For a film that inhibits copper diffusion, silicon nitride can be used, for example. Alternatively, a metal oxide such as an aluminum oxide may be used.

For the insulator 216, a silicon oxide film or a silicon oxynitride film can be used, for example.

The details of an insulator 280 and the transistor Tr1 are described in Embodiment 3.

The insulator 305 can be formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

Alternatively, the insulator 305 may have a stacked-layer structure using any of the above insulators. For example, the insulator 305 may have a stacked-layer structure using a material with high dielectric strength (e.g., silicon oxynitride) and a high dielectric (high-k) material (e.g., aluminum oxide). With this structure, the capacitor Cs can have a sufficient capacitance, and electrostatic breakdown can be prevented.

The conductors, wirings, and plugs illustrated in FIG. 14 each preferably have a single-layer structure or a stacked-layer structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. Moreover, it is preferable to use a low-resistance conductive material such as aluminum or copper.

Figure 16:
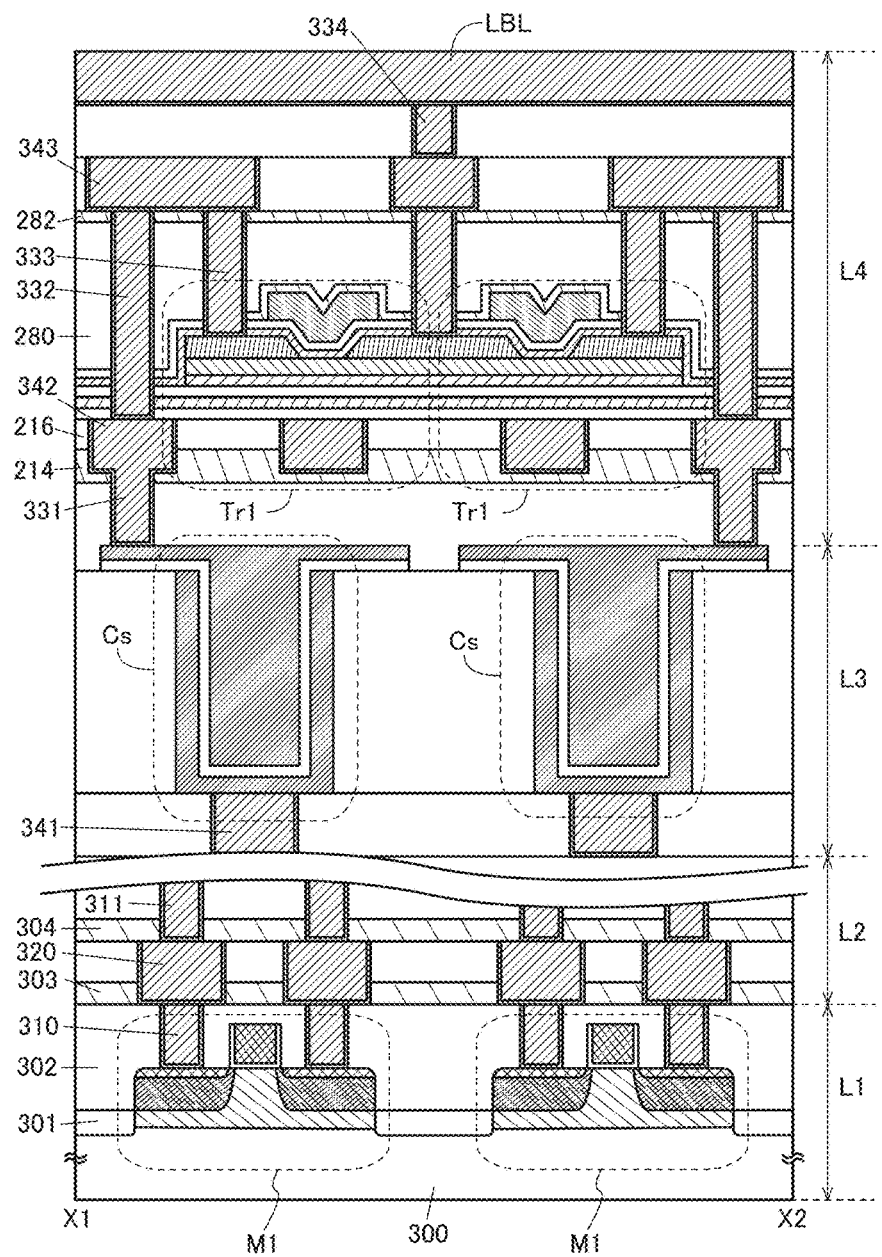
FIG. 16 is a cross-sectional view illustrating a structure example of a memory device.

In the memory device 100 shown in FIG. 14, the transistor Tr1 may be formed over the capacitor Cs; FIG. 16 shows a cross-sectional view of the memory device 100 with this structure. The cross-sectional view in FIG. 16 is different from that in FIG. 14 in the layer L3 and the layer L4.

In FIG. 16, the layer L3 includes a wiring 341 and the capacitor Cs.

In FIG. 16, the layer L4 includes a plug 331, a plug 332, a plug 333, a plug 334, a wiring 342, a wiring 343, the wiring BL, the insulator 214, the insulator 216, the insulator 280, the insulator 282, and the transistor Tr1.

Providing the capacitor Cs below the transistor Tr1 can prevent the transistor Tr1 from being affected by hydrogen or process damage caused during formation of the capacitor Cs.

In FIG. 14 and FIG. 16, regions without reference numerals or hatch patterns represent regions formed of an insulator. As the insulator, it is possible to use an insulator containing at least one material selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for these regions, an organic resin such as a polyimide resin, a polyamide resin, an acrylic resin, a siloxane resin, an epoxy resin, or a phenol resin can be used.

The memory device 100 may include a plurality of sub arrays. A structure example in that case is illustrated in FIG. 17.

FIG. 17 is a schematic top view showing an example of the memory device 100. The memory device 100 includes a plurality of sub arrays 150. Each of the sub arrays 150 includes the memory cell array 110, the row driver 123, and the column driver 124. A power supply line 151 is provided to surround the plurality of sub arrays 150.

In the memory device 100, the semiconductor device 10 can be provided outside the memory cell, e.g., under the power supply line 151 shown in FIG. 17. Thus, the area overhead of the memory device 100 can be reduced.

(Embodiment 3)

In this embodiment, structures of the OS transistors used in any of the above embodiments are described.

<<Metal Oxide>>

First, a metal oxide used for an OS transistor is described.

A metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where a metal oxide is In-M-Zn oxide containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Next, preferred ranges of the atomic ratio of indium, the element M, and zinc contained in the metal oxide according to the present invention are described with reference to FIGS. 20A to 20C. Note that the proportion of oxygen atoms is not shown in FIGS. 20A to 20C. The terms of the atomic ratio of indium to the element M and zinc contained in the metal oxide are denoted by [In], [M], and [Zn], respectively.

Figure 20A:
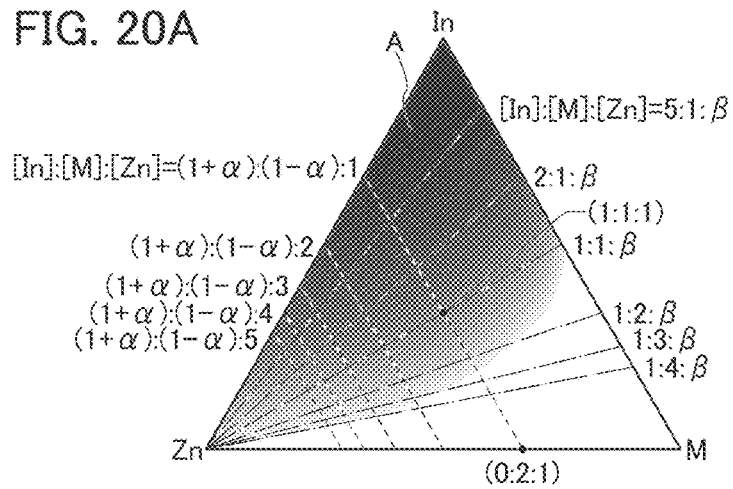
FIGS. 20A to 20C each illustrate an atomic ratio range of a metal oxide.
Figure 20B:
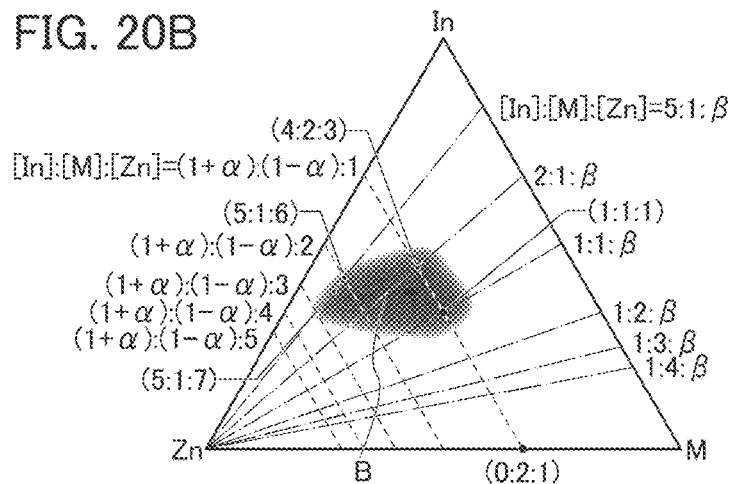
Figure 20C:
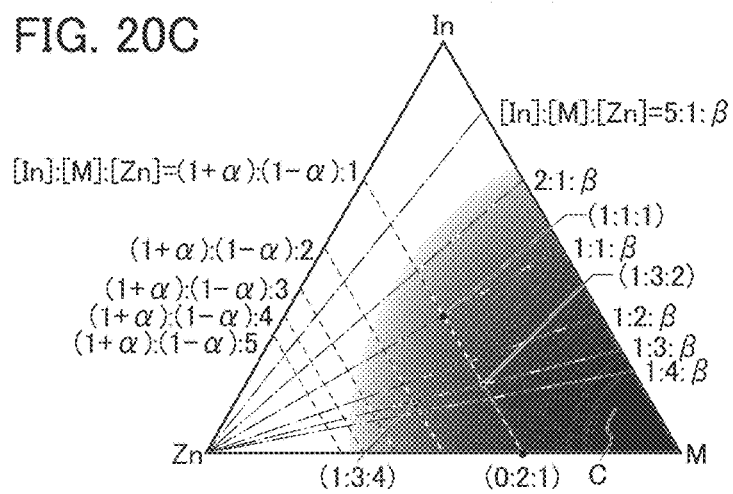

In FIGS. 20A to 20C, the broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+a):(1-\alpha):5$.

The dashed-dotted lines indicate a line where the atomic ratio [In]:[M]:[Zn] is $5:1:\beta$, where $\beta \geq 0$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

A metal oxide having the atomic ratio of [In]:[M]:[Zn]=0:2:1 or in the neighborhood thereof in FIGS. 20A to 20C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 20A shows an example of the preferred ranges of the atomic ratio of indium to the element M and zinc contained in a metal oxide.

In addition, a metal oxide having a high content of indium can have high carrier mobility (electron mobility). Thus, a metal oxide having a high content of indium has higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and the neighborhood thereof (e.g., a region C in FIG. 20C), insulation performance becomes better.

Accordingly, a metal oxide of one embodiment of the present invention preferably has an atomic ratio represented by the region A in FIG. 20A. With the atomic ratio, a layered structure with high carrier mobility and a few grain boundaries is easily obtained.

In the region A, in particular a region B in FIG. 20B, an excellent oxide which easily becomes a c-axis aligned crystalline oxide semiconductor (CAAC-OS) and has high carrier mobility can be obtained.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in the a-b plane direction, an interatomic bond distance changed by substitution of a metal element, and the like.

The CAAC-OS is a metal oxide with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of a metal oxide is not uniquely determined by an atomic ratio. Even with the same atomic ratio, the property of a metal oxide might be different depending on a formation condition. For example, in the case where the metal oxide is formed with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

<<Transistor Structure 1>>

Figure 21A:
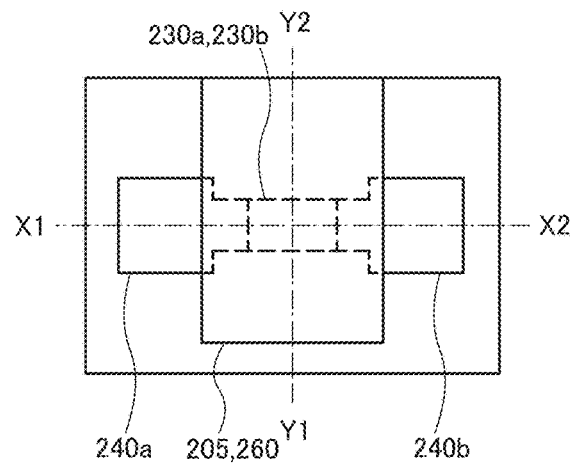
FIGS. 21A and 21B are a top view and cross-sectional views illustrating a structure example of a transistor.
Figure 21B:
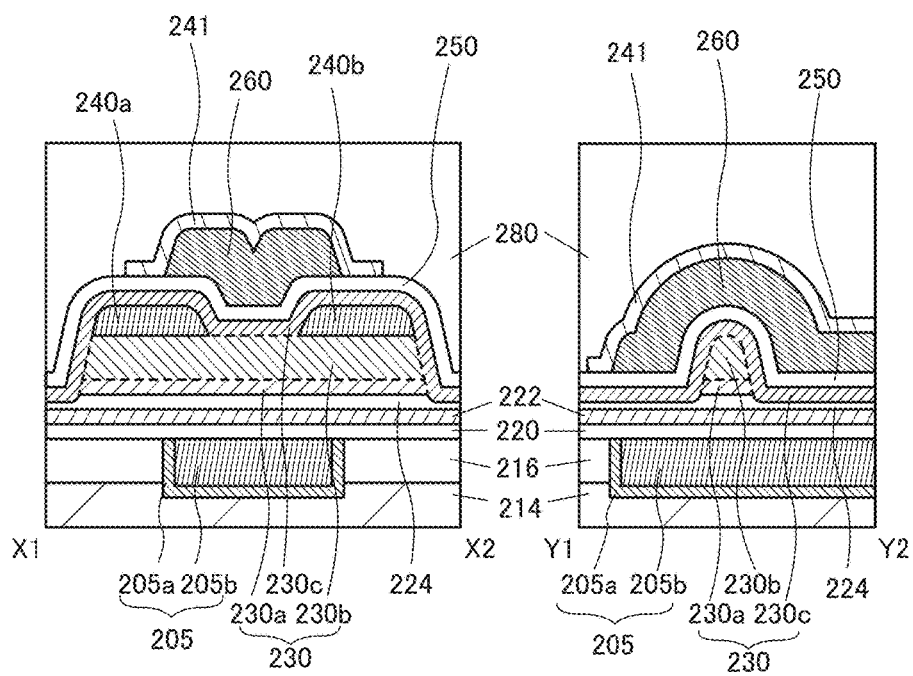

FIGS. 21A and 21B are a top view and cross-sectional views of a transistor 200a. FIG. 21A is the top view. The view on the left of FIG. 21B is the cross-sectional view taken along dashed-dotted line X1-X2 in FIG. 21A. The view on the right of FIG. 21B is the cross-sectional view taken along dashed-dotted line Y1-Y2 in FIG. 21A. Note that for simplification of the drawing, some components in the top view in FIG. 21A are not illustrated.

FIG. 21B illustrates an example in which the transistor 200a is provided over the insulator 214 and the insulator 216.

The transistor 200a includes a conductor 205 (conductors 205a and 205b) and a conductor 260 that function as gate electrodes, insulators 220, 222, 224, and 250 that function as gate insulators, a metal oxide 230 (metal oxides 230a, 230b, and 230c), a conductor 240a that functions as one of a source and a drain, a conductor 240b that functions as the other of the source and the drain, an insulator 241 that protects the conductor 260, and the insulator 280 that contains excess oxygen (contains oxygen in excess of that in the stoichiometric composition).

In the transistor 200a, the conductor 260 is referred to as a top gate and the conductor 205 is referred to as a bottom gate in some cases. Alternatively, the conductor 260 is referred to as a front gate and the conductor 205 is referred to as a second gate in some cases.

The metal oxide 230 includes the metal oxide 230a, the metal oxide 230b over the metal oxide 230a, and the metal oxide 230c over the metal oxide 230b. When the transistor 200a is turned on, current flows (a channel is formed) mainly in the metal oxide 230b. This means that the metal oxide 230b functions as a channel formation region. Although current sometimes flows through a region in the vicinity of the interface (a mixed region in some cases) between the metal oxide 230b and each of the metal oxide 230a and the metal oxide 230c, the metal oxide 230a and the metal oxide 230c function as insulators at the other region.

The energy level of the conduction band minimum of each of the metal oxides 230a and 230c is closer to the vacuum level than that of the metal oxide 230b. Typically, a difference between the energy level of the conduction band minimum of the metal oxide 230b and the energy level of the conduction band minimum of each of the metal oxides 230a and 230c is preferably greater than or equal to 0.15 eV or greater than or equal to 0.5 eV, and less than or equal to 2 eV or less than or equal to 1 eV. That is, a difference in the electron affinity between each of the metal oxides 230a and 230c and the metal oxide 230b is preferably greater than or equal to 0.15 eV or greater than or equal to 0.5 eV and less than or equal to 2 eV or less than or equal to 1 eV.

The energy gap of the metal oxide 230b is preferably 2 eV or more, further preferably 2.5 eV or more and 3.0 eV or less. Furthermore, the energy gap of each of the metal oxides 230a and 230c is preferably greater than or equal to 2 eV, further preferably greater than or equal to 2.5 eV, and still further preferably greater than or equal to 2.7 eV and less than or equal to 3.5 eV. The energy gap of each of the metal oxides 230a and 230c is preferably greater than the energy gap of the metal oxide 230b. For example, a difference in the energy gap between each of the metal oxides 230a and 230c and the metal oxide 230b is preferably greater than or equal to 0.15 eV, greater than or equal to 0.5 eV, or greater than or equal to 1.0 eV, and less than or equal to 2 eV or less than or equal to 1 eV.

The thickness of each of the metal oxides 230a, 230b, and 230c is greater than or equal to 3 nm and less than or equal to 200 nm, preferably greater than or equal to 3 nm and less than or equal to 100 nm, further preferably greater than or equal to 3 nm and less than or equal to 60 nm.

A decrease in the carrier density of the metal oxide can inhibit the negative shift of the threshold voltage of the transistor or reduce the off-state current of the transistor, which is preferable. Examples of a factor affecting the carrier density of a metal oxide include oxygen vacancy ($V_O$) and impurities in the metal oxide. As the amount of oxygen vacancy in the metal oxide increases, the density of defect states increases when hydrogen is bonded to the oxygen vacancy (this state is also referred to as VoH). The density of defect states also increases with an increase in the amount of impurity in the metal oxide. Hence, the carrier density of a metal oxide can be controlled by controlling the density of defect states in the metal oxide.

For example, the carrier density of each of the metal oxides 230a and 230c is lower than $8 \times 10^{15}$ cm$^{-3}$, preferably lower than $1 \times 10^{11}$ cm$^{-3}$, and further preferably lower than $1 \times 10^{10}$ cm$^{-3}$ and higher than or equal to $1 \times 10^{-9}$ cm$^{-3}$.

In contrast, the carrier density of the metal oxide is preferably increased in order to improve the on-state current of the transistor or improve the field-effect mobility of the transistor. In order to increase the carrier density of the metal oxide, the impurity concentration of the metal oxide is slightly increased, or the band gap of the metal oxide is narrowed.

The carrier density of the metal oxide 230b is preferably higher than those of the metal oxide 230a and the metal oxide 230c.

The density of defect states in a mixed layer formed at an interface between the metal oxides 230a and 230b or an interface between the metal oxides 230b and 230c is preferably made low. Specifically, when the metal oxides 230a and 230b or the metal oxides 230b and 230c contain the same element (as a main component) in addition to oxygen, a mixed layer with a low density of defect states can be formed. For example, in the case where the metal oxide 230b is an In—Ga—Zn oxide, it is preferable to use an In—Ga—Zn oxide, a Ga—Zn oxide, gallium oxide, or the like as each of the metal oxides 230a and 230c.

At this time, the metal oxide 230b serves as a main carrier path. Since the density of defect states at the interface between the metal oxides 230a and 230b and the interface between the metal oxides 230b and 230c can be made low, the influence of interface scattering on carrier conduction is small, and high on-state current can be obtained.

A material whose conductivity is sufficiently lower than that of the metal oxide 230b is used for the metal oxides 230a and 230c. For example, a metal oxide with high insulation performance and the atomic ratio represented by the region C in FIG. 20C can be used as the metal oxides 230a and 230c. Note that the region C in FIG. 20C represents the atomic ratio [In]:[M]:[Zn] of 0:1:0, 1:3:2, and 1:3:4 and the vicinities thereof.

In the case where a metal oxide with any of the atomic ratios represented by the region A in FIG. 20A is used as the metal oxide 230b, it is particularly preferable to use a metal oxide with [M]/[In] of greater than or equal to 1, preferably greater than or equal to 2 as each of the metal oxides 230a and 230c. In addition, it is suitable to use a metal oxide with sufficiently high insulation performance and [M]/([Zn]+[In]) of greater than or equal to 1 as the metal oxide 230c.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property with respect to hydrogen, e.g., tantalum nitride, may be used as the conductor 205a, and tungsten, which has high conductivity, may be stacked thereover as the conductor 205b. The use of the combination of the materials can prevent diffusion of hydrogen into the metal oxide 230 while conductivity of a wiring is ensured. Note that a two-layer structure of the conductor 205a and the conductor 205b is illustrated in FIG. 21B; however, one embodiment of the present invention is not limited thereto, and a single-layer structure or a stacked-layer structure of three or more layers may be used.

Each of the insulators 220 and 224 is preferably an insulator containing oxygen, such as a silicon oxide film or a silicon oxynitride film. In particular, the insulator 224 is preferably an insulator containing excess oxygen. In the case where such an insulator containing excess oxygen is provided in contact with the metal oxide in the transistor 200a, oxygen vacancies in the metal oxide can be compensated. Note that the insulators 220 and 224 are not necessarily formed of the same material.

The insulator 222 preferably has a single-layer structure or a stacked-layer structure using an insulator containing a high-k material such as silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST), for example. Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

The threshold voltages can be controlled by appropriate adjustment of the thicknesses of the insulator 220, the insulator 222, and the insulator 224. A transistor having a low leakage current in an off state can be provided. The insulator 220, the insulator 222, and the insulator 224 are preferably thin, in which case, the threshold voltage can be easily controlled by the conductor 205. For example, each of the thicknesses of the insulators 220, 222, and 224 is less than or equal to 50 nm, preferably less than or equal to 30 nm, further preferably less than or equal to 10 nm, and still further preferably less than or equal to 5 nm.

The insulator 250 can have a single-layer structure or a stacked-layer structure using one or more of insulators such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), and (Ba,Sr)TiO$_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used. When such an insulator containing excess oxygen is provided in contact with the metal oxide 230, oxygen vacancies in the metal oxide 230 can be reduced.

As the insulator 250, an insulating film formed of aluminum oxide, aluminum oxynitride, hafnium oxide, hafnium oxynitride, silicon nitride, or the like, which has barrier properties against oxygen and hydrogen, can be used. The insulator 250 formed of such a material serves as a layer which prevents release of oxygen from the metal oxide 230 and entry of an impurity such as hydrogen from the outside.

Any of metals such as aluminum, titanium, chromium, nickel, copper, yttrium, zirconium, molybdenum, silver, tantalum, and tungsten, or an alloy containing any of the metals as its main component can be used for each of the conductors 240a and 240b. Although a single-layer structure is illustrated in the drawings, a stacked-layer structure of two or more layers may be used.

For example, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, or an alloy containing any of these metals in combination. Furthermore, one or both of manganese and zirconium may be used. Alternatively, a semiconductor typified by polycrystalline silicon doped with an impurity element such as phosphorus, or a silicide such as nickel silicide may be used.

A two-layer structure where a titanium film is stacked over an aluminum film may be employed, for example. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked structure using the above-described light-transmitting conductive material and the above-described metal.

By using a material with a high work function for the conductor 260, the threshold voltage of the transistor 200a can be increased and the cutoff current can be lowered. A conductive material whose work function is preferably greater than or equal to 4.8 eV, further preferably greater than or equal to 5.0 eV, still further preferably greater than or equal to 5.2 eV, yet further preferably greater than or equal to 5.4 eV, and yet still further preferably greater than or equal to 5.6 eV is used for the conductor 260. Examples of a conductive material having a high work function include molybdenum, molybdenum oxide, platinum (Pt), platinum (Pt) silicide, nickel (Ni) silicide, indium tin oxide, and In—Ga—Zn oxide to which nitrogen is added.

The insulator 241 is provided to cover the conductor 260. As the insulator 241, it is possible to use an insulating film with barrier properties against oxygen and hydrogen, such as a film formed of aluminum oxide, aluminum oxynitride, hafnium oxide, hafnium oxynitride, or silicon nitride. Using any of these materials can prevent oxidation of the conductor 260 by heat treatment. Note that the insulator 241 can be omitted when a material that is hard to oxidize is used as the conductor 260.

An insulator 280 is provided over the transistor 200a. The insulator 280 preferably contains excess oxygen. In particular, when an insulator containing excess oxygen is provided as an interlayer film or the like in the vicinity of the transistor 200a, oxygen vacancies in the transistor 200a are reduced, whereby the reliability can be improved.

As the insulator containing excess oxygen, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 200a may function as a planarization film that covers a roughness thereunder.

<<Transistor Structure 2>>

Figure 22A:
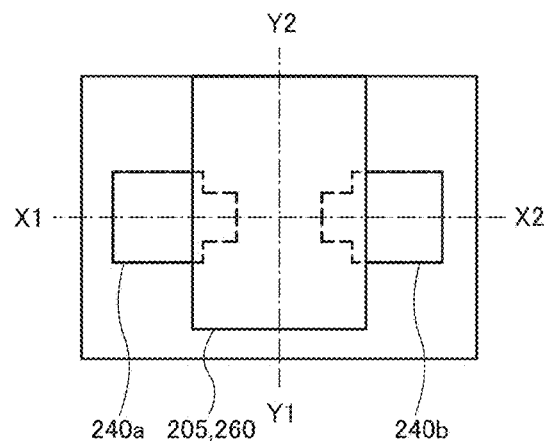
FIGS. 22A and 22B are a top view and cross-sectional views illustrating a structure example of a transistor.
Figure 22B:
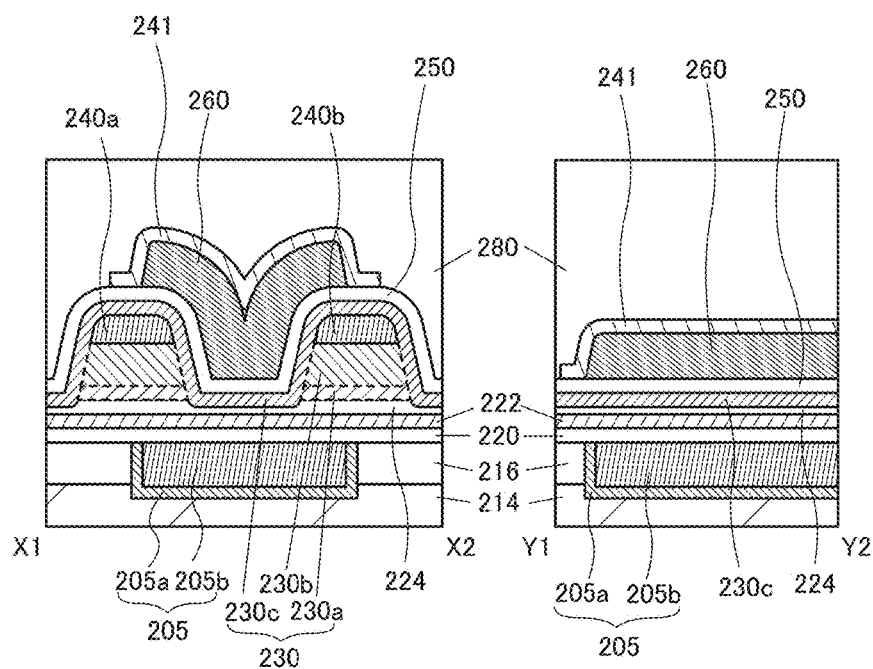

FIGS. 22A and 22B are a top view and cross-sectional views of a transistor 200b. FIG. 22A is a top view. The view on the left of FIG. 22B is a cross-sectional view corresponding to the dashed-dotted line X1-X2 in FIG. 22A. The view on the right of FIG. 22B is a cross-sectional view corresponding to the dashed-dotted line Y1-Y2 in FIG. 22A. Note that for simplification of the drawing, some components are not illustrated in the top view in FIG. 22A.

The transistor 200b in FIGS. 22A and 22B corresponds to the transistor 200a in FIGS. 21A and 21B in which center portions of the metal oxides 230a and 230b are etched (see the view on the left of FIG. 22B).

In the transistor 200a shown in FIGS. 21A and 21B, a channel is formed in the metal oxide 230b. In the transistor 200b shown in FIGS. 22A and 22B, a channel is formed in the metal oxide 230c. The metal oxide 230c has lower electron mobility and a wider band gap than the metal oxide 230b. Thus, the transistor 200b has lower on-state current and lower off-state current than the transistor 200a. The transistor 200b is suitably used as a transistor whose off-state current is more valued than the on-state current.

The transistor 200b can be formed concurrently with the formation of the transistor 200a. For example, it is preferable to use the transistor 200a for transistors requiring high on-state current, e.g., the transistor M10 in FIG. 1 and the transistor Tr1 in FIG. 8, and use the transistor 200b for a transistor requiring low off-state current, e.g., the transistor M11 in FIG. 1.

(Embodiment 4)

In this embodiment, a resistor capable of being used as the temperature sensor 17 shown in FIG. 1 is described.

Figure 18:
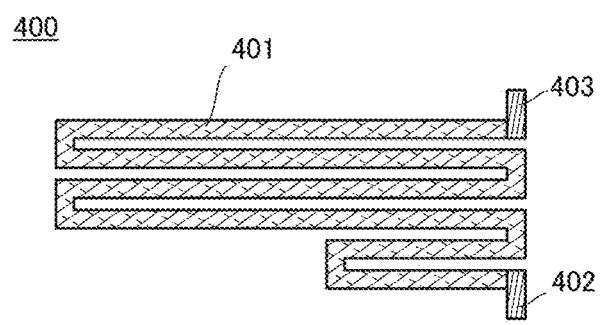
FIG. 18 is a top view illustrating a structure example of a resistor.

FIG. 18 is a top view of a resistor 400. The resistor 400 includes a metal oxide 401, a conductor 402, and a conductor 403. The metal oxide 401 includes a meandering portion in the top view.

The resistivity of the metal oxide 401 changes with temperature. In the resistor 400, current is fed between the conductors 402 and 403 and the resistance of the metal oxide 401 is measured, whereby a temperature can be detected.

FIG. 19 is a schematic cross-sectional view in which the resistor 400 is included in the cross-sectional view of the memory device 100 shown in FIG. 14. The resistor 400 is provided in the layer L3 in which the transistor Tr1 (an OS transistor) is provided.

The metal oxide 401 used in the resistor 400 is the same as the metal oxide 230b used in the transistor Tr1. The resistivity of the metal oxide 401 that is not subjected to any treatment is so high that the metal oxide 401 cannot function satisfactorily as a resistor. Therefore, the metal oxide 401 is preferably subjected to treatment for reducing the resistivity after the metal oxide 401 is etched to have the shape shown in FIG. 18.

An example of the above-described treatment for reducing the resistivity is plasma treatment that uses a rare gas such as He, Ar, Kr, or Xe. The plasma treatment may be performed using a mixed gas of the rare gas and nitrogen oxide, ammonium, nitrogen, or hydrogen. By the above-described plasma treatment, an oxygen vacancy is formed in the metal oxide 401, so that the resistivity of the metal oxide 401 can be reduced.

Another example of the above-described treatment for reducing the resistivity is treatment in which a film containing much hydrogen such as silicon nitride is formed to be in contact with the metal oxide 401. By adding hydrogen to the metal oxide 401, the resistivity of the metal oxide 401 can be reduced.

By any of the above-described examples of treatment for reducing the resistivity, the resistivity of the metal oxide 401 at room temperature can be higher than or equal to $1 \times 10^{-3}$ $\Omega$cm and lower than or equal to $1 \times 10^4$ $\Omega$cm.

When the resistor 400 is formed in the layer in which the transistor Tr1 is formed as shown in FIG. 19, the resistor 400 can detect the temperature of the transistor Tr1 accurately. Furthermore, the resistor 400 and the transistor Tr1 can be formed in the same step, and therefore, a process can be shortened compared with a process in which the resistor 400 and the transistor Tr1 are formed in different steps.

Note that in the case where the metal oxide 401 of the resistor 400 and the metal oxide 230b of the transistor Tr1 are formed of different materials, the resistor 400 may be formed in a layer over the layer L4.

(Embodiment 5)

In this embodiment, examples of a semiconductor wafer, an IC chip, and an electronic component each including the memory device or the semiconductor device described in the above embodiments are described with reference to FIGS. 23A and 23B and FIGS. 25A to 25F.

<Semiconductor Wafer and Chip>

Figure 23A:
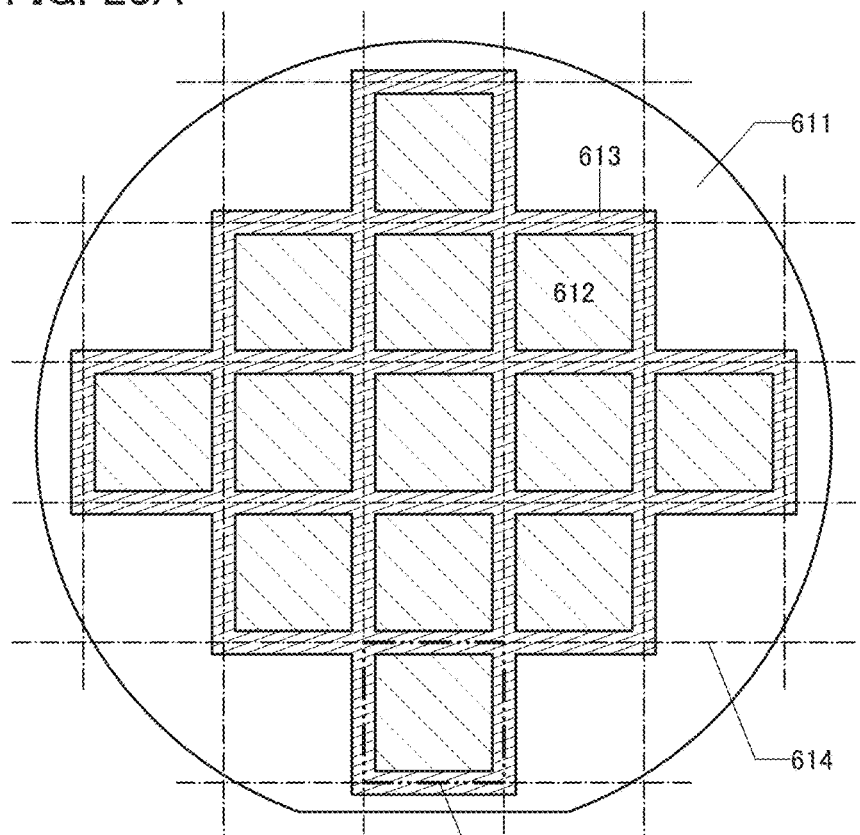
FIGS. 23A and 23B are top views of a semiconductor wafer.

FIG. 23A is a top view illustrating a substrate 611 before dicing treatment. As the substrate 611, a semiconductor substrate (also referred to as semiconductor wafer) can be used, for example. The substrate 611 has a plurality of circuit regions 612. The semiconductor device shown in any of the foregoing embodiments, for example, can be provided in the circuit region 612.

Figure 23B:
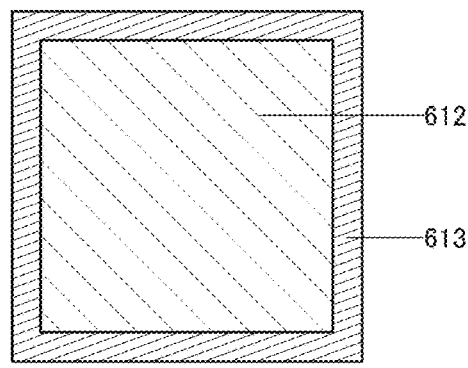

Each of the circuit regions 612 is surrounded by a separation region 613. Separation lines (also referred to as dicing lines) 614 are set at a position overlapping the separation regions 613. Chips 615 each including the circuit region 612 can be cut from the substrate 611 by cutting the substrate 611 along the separation lines 614. FIG. 23B is an enlarged view of the chip 615.

A conductive layer or a semiconductor layer may be provided in the separation regions 613. Providing a conductive layer or a semiconductor layer in the separation regions 613 relieves electrostatic discharge (ESD) that might be caused in a dicing step, preventing a decrease in the yield in the dicing step. A dicing step is generally performed while letting pure water whose specific resistance is decreased by the inclusion of a carbonic acid gas or the like flow to a cut portion, in order to cool down a substrate, remove swarf, and prevent electrification, for example. Providing a conductive layer or a semiconductor layer in the separation regions 613 allows a reduction in the usage of the pure water. Therefore, the cost of manufacturing the semiconductor device can be reduced. Moreover, the semiconductor device can be manufactured with improved productivity.

For a semiconductor layer provided in the separation regions 613, it is preferable to use a material having a bandgap greater than or equal to 2.5 eV and less than or equal to 4.2 eV, preferably greater than or equal to 2.7 eV and less than or equal to 3.5 eV. The use of such a material allows accumulated charge to be released slowly; thus, rapid move of charge due to ESD can be suppressed and electrostatic breakdown is less likely to occur.

<Electronic Component>

Figure 24A:
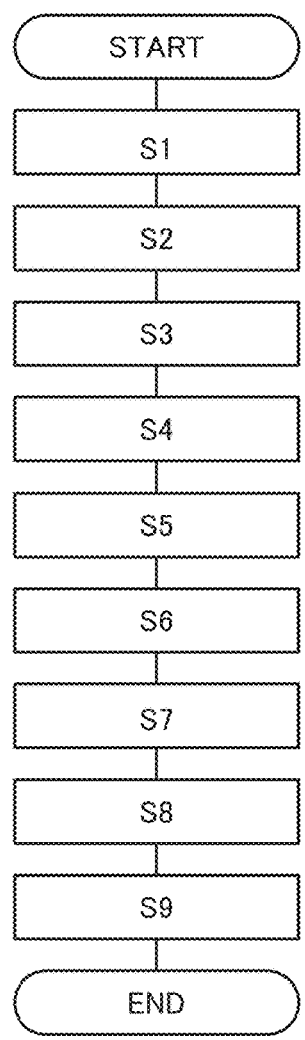
FIG. 24A is a flow chart illustrating fabrication steps of a semiconductor device.
Figure 24B:
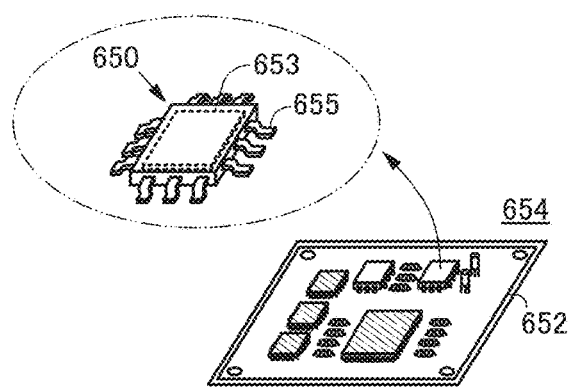
FIG. 24B is a perspective view of the semiconductor device.

FIGS. 24A and 24B show an example where the chip 615 is used to make an electronic component. Note that an electronic component is also referred to as a semiconductor package or an IC package. For electronic components, there are various standards and names corresponding to the direction or the shape of terminals.

An electronic component is completed by combining the semiconductor device described in any of the above embodiments and components other than the semiconductor device in the assembly process (post-process).

The post-process is described with reference to a flow chart in FIG. 24A. After an element substrate including the semiconductor device described in any of the above embodiments is completed in a pre-process, a back surface grinding step is performed to grind a back surface (a surface where the semiconductor device and the like are not formed) of the element substrate (Step S1). When the element substrate is thinned by grinding, warpage or the like of the element substrate is reduced, resulting in the reduction in size of the electronic component.

Next, a dicing step is performed to divide the element substrate into a plurality of chips (Step S2). Then, a die bonding step is performed to pick up the divided chips separately and bond them to a lead frame (Step S3). To bond a chip and a lead frame in the die bonding step, resin bonding, tape-automated bonding, or the like is selected as determined as appropriate by products. Note that the chip may be bonded to an interposer instead of the lead frame.

Next, a wire bonding step is performed to electrically connect a lead of the lead frame and an electrode on the chip through a metal fine line (wire) (Step S4). A silver line or a gold line can be used as the metal fine line. Ball bonding or wedge bonding can be used as the wire bonding.

The wire-bonded chip is subjected to a sealing step (molding step) of sealing the chip with an epoxy resin or the like (Step S5). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a lead plating step is performed to plate the lead of the lead frame (Step S6). With the plating process, corrosion of the lead can be prevented, and soldering for mounting the electronic component on a printed circuit board in a later step can be performed with higher reliability. Then, a lead processing step is performed to cut and process the lead (Step S7).

Next, a marking step is performed to printing (marking) on a surface of the package (Step S8). After a testing step (Step S9) for checking whether an external shape is good and whether there is malfunction, for example, the electronic component is completed.

FIG. 24B is a schematic perspective view of the completed electronic component. FIG. 24B shows a perspective schematic diagram of a quad flat package (QFP) as an example of the electronic component. An electronic component 650 illustrated in FIG. 24B includes a lead 655 and a semiconductor device 653. As the semiconductor device 653, the memory device or the semiconductor device described in any of the above embodiments can be used, for instance.

The electronic component 650 in FIG. 24B is, for example, mounted on a printed circuit board 652. A plurality of electronic components 650 are used in combination and electrically connected to each other over the printed wiring board 652; thus, a board 654 on which the electronic components are mounted is completed. The completed board 654 is used in an electronic device or the like.

(Embodiment 6)

The memory device or the semiconductor device described in the above embodiment is preferably used in an electronic device incorporating a battery. The memory device or semiconductor device described in the above embodiment is preferably used in an electronic device incorporating a battery, in which case power consumption of the electronic device can be reduced, and power of the battery can be saved. Specific examples are illustrated in FIGS. 25A to 25F.

Figure 25A:
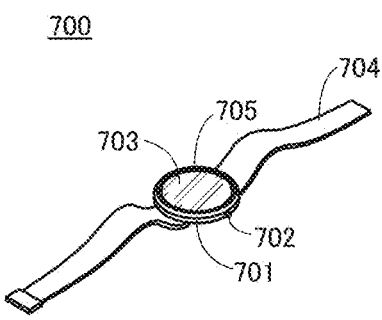
FIGS. 25A to 25F are perspective views illustrating examples of an electronic device.

FIG. 25A illustrates an example of a wristwatch terminal 700. The wristwatch terminal 700 includes a housing 701, a winding crown 702, a display portion 703, a belt 704, a sensing unit 705, and the like. A battery and the memory or semiconductor device are provided inside the housing 701. The display portion 703 may be provided with a touch panel. A user can input information by using finger touching the touch panel as a pointer.

The sensing unit 705 has a function of obtaining information by measuring a surrounding state. For example, a camera, an acceleration sensor, a direction sensor, a pressure sensor, a temperature sensor, a humidity sensor, an illuminance sensor, or a global positioning system (GPS) signal receiver circuit can be used as the sensing unit 705.

For example, when an arithmetic device in the housing 701 determines that the ambient light level measured by an illuminance sensor of the sensing unit 705 is sufficiently higher than predetermined illuminance, the luminance of the display portion 703 is lowered. Meanwhile, when the arithmetic device determines that the ambient light level is not sufficiently high, the luminance of the display portion 703 is increased. As a result, power consumption of the electronic device can be reduced.

Figure 25B:
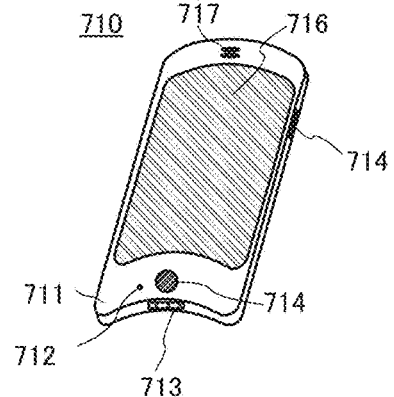

FIG. 25B illustrates a mobile phone 710. The mobile phone 710 includes a housing 711, a display portion 716, operation buttons 714, an external connection port 713, a speaker 717, a microphone 712, and the like. A battery and the memory or semiconductor device are provided inside the housing 711. When the display portion 716 of the mobile phone 710 is touched with a finger or the like, data can be input to the mobile phone 710. Operations such as making a call and inputting letters can be performed by touch on the display portion 716 with a finger or the like. The power can be turned on or off with the operation button 714. In addition, types of images displayed on the display portion 716 can be switched; for example, switching images from a mail creation screen to a main menu screen is performed with the operation button 714.

Figure 25C:
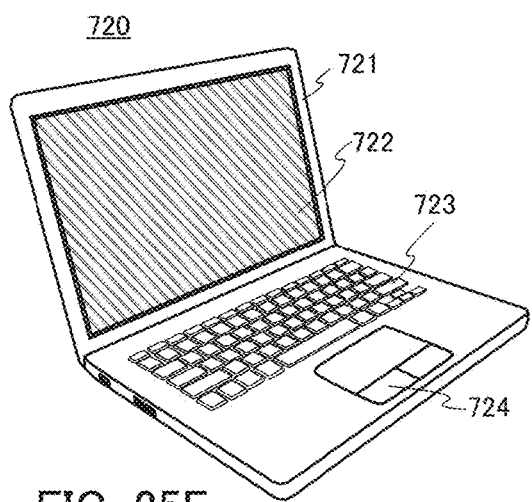

FIG. 25C illustrates a laptop personal computer 720 including a housing 721, a display portion 722, a keyboard 723, a pointing device 724, and the like. A battery and the memory or semiconductor device are provided inside the housing 711.

Figure 25D:
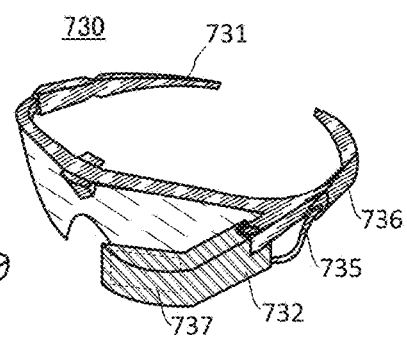

FIG. 25D illustrates a goggle-type display 730. The goggle-type display 730 includes temples 731, a housing 732, a cable 735, a battery 736, and a display portion 737. The battery 736 is held in the temple 731. The display portion 737 is provided in the housing 732. The housing 732 incorporates a variety of electronic components such as a semiconductor device, a wireless communication device, and a memory device. Power is supplied from the battery 736 through the cable 735 to the display portion 737 and the electronic components in the housing 732. A variety of information such as an image transmitted wirelessly is displayed on the display portion 737.

A camera may be provided in the housing 732 of the goggle-type display 730. A user can operate the goggle-type display 730 owing to the camera, which senses movement of the eye and eyelid of the user. The temple 731 of the goggle-type display 730 may be provided with various sensors such as a temperature sensor, a pressure sensor, an acceleration sensor, and a biosensor. For example, the goggle-type display 730 obtains biological information on the user with a biosensor and stores the information in the memory device of the housing 732. The goggle-type display 730 may transmit biological information to another information appliance with a wireless signal.

Figure 25E:
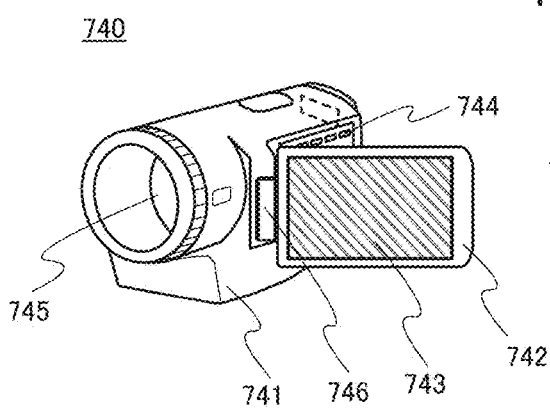

FIG. 25E illustrates a video camera 740. The video camera 740 includes a first housing 741, a second housing 742, a display portion 743, an operation key 744, a lens 745, a joint 746, and the like. The operation key 744 and the lens 745 are provided in the first housing 741, and the display portion 743 is provided in the second housing 742. A battery and the memory or semiconductor device are provided inside the first housing 741. The battery may be provided outside the first housing 741. The first housing 741 and the second housing 742 are connected to each other with the joint 746, and the angle between the first housing 741 and the second housing 742 can be changed with the joint 746. Images on the display portion 743 may be switched in accordance with the angle at the joint 746 between the first housing 741 and the second housing 742.

Figure 25F:
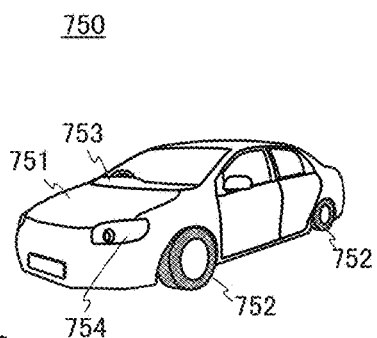

FIG. 25F illustrates an automobile 750. The automobile 750 includes a car body 751, wheels 752, a dashboard 753, lights 754, and the like. A battery and the memory or semiconductor device are provided inside the car body 751.

(Embodiment 7)

In this embodiment, described is the composition of a cloud-aligned composite oxide semiconductor (CAC-OS) applicable to an OS transistor disclosed in the above embodiments.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

Unless otherwise specified, on-state current in this specification refers to drain current of a transistor in an on state. Unless otherwise specified, the on state (also sometimes abbreviated to "on") of an n-channel transistor means that the voltage between its gate and source ($V_G$) is higher than or equal to the threshold voltage ($V_{th}$), and the on state of a p-channel transistor means that $V_G$ is lower than or equal to $V_{th}$. For example, the on-state current of an n-channel transistor refers to a drain current that flows when $V_G$ is higher than or equal to $V_{th}$. The on-state current of a transistor depends on a voltage $V_D$ between a drain and a source.

Unless otherwise specified, off-state current in this specification refers to drain current of a transistor in an off state. Unless otherwise specified, the off state (also sometimes abbreviated to "off") of an n-channel transistor means that $V_G$ is lower than $V_{th}$, and the off state of a p-channel transistor means that $V_G$ is higher than $V_{th}$. For example, the off-state current of an n-channel transistor refers to a drain current that flows when $V_G$ is lower than $V_{th}$. The off-state current of a transistor depends on $V_G$ in some cases. Thus, "the off-state current of a transistor is lower than $10^{-21}$ A" may mean there is $V_G$ at which the off-state current of the transistor is lower than $10^{-21}$ A.

The off-state current of a transistor depends on $V_D$ in some cases. Unless otherwise specified, the off-state current in this specification may be off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_D$ used in a semiconductor device or the like including the transistor.

For example, in this specification and the like, an explicit description "X and Y are connected" means that X and Y are electrically connected, X and Y are functionally connected, and X and Y are directly connected.

Here, X and Y each denote an object (e.g., a device, an element, a circuit, a wiring, an electrode, a terminal, a conductive film, or a layer).

Examples of the case in which X and Y are directly connected include a case in which X and Y are connected without elements that enable an electrical connection between X and Y, such as a switch, a transistor, a capacitor, an inductor, a resistor, a diode, a display element, a light-emitting element, or a load, connected between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that a switch is conducting or not conducting (turned on or off) to determine whether current flows therethrough or not. Alternatively, the switch has a function of selecting and changing a current path. Note that the case where X and Y are electrically connected includes the case where X and Y are directly connected.

[Example]

In this example, the simulation of the operation frequency of the memory device 100 described in Embodiment 2 was performed.

To perform the simulation of the operation frequency of the memory device 100, a prototype of the transistor 200a shown in FIGS. 21A and 21B was formed, and a parameter required for the simulation was extracted from the electrical characteristics of the transistor 200a.

In the prototype of the transistor 200a, L (channel length) was 60 nm and W (channel width) was 60 nm.

In the prototype of the transistor 200a, the metal oxide 230a was an In—Ga—Zn oxide having a thickness of 5 nm. The metal oxide 230a was formed by a DC sputtering method using a target of an In—Ga—Zn oxide containing In, Ga, and Zn at an atomic ratio of 1:3:4. The sputtering method was performed at a substrate temperature of 200° C. in a mixed gas of argon and oxygen.

In the prototype of the transistor 200a, the metal oxide 230b was an In—Ga—Zn oxide having a thickness of 15 nm. The metal oxide 230b was formed by a DC sputtering method using a target of an In—Ga—Zn oxide containing In, Ga, and Zn at an atomic ratio of 4:2:4.1. The sputtering method was performed at a substrate temperature of 200° C. in a mixed gas of argon and oxygen.

In the prototype of the transistor 200a, the metal oxide 230c was an In—Ga—Zn oxide having a thickness of 5 nm. The metal oxide 230c was formed by a DC sputtering method using a target of an In—Ga—Zn oxide containing In, Ga, and Zn at an atomic ratio of 1:3:2. The sputtering method was performed at a substrate temperature of 200° C. in a mixed gas of argon and oxygen.

In this example, the simulation of the operation of the memory device 100 was performed on the assumption that the transistor 200a was used as the transistor Tr1 in FIG. 8. The electrical characteristics of the prototype of the transistor 200a were measured to obtain a parameter required for the simulation.

Figure 26:
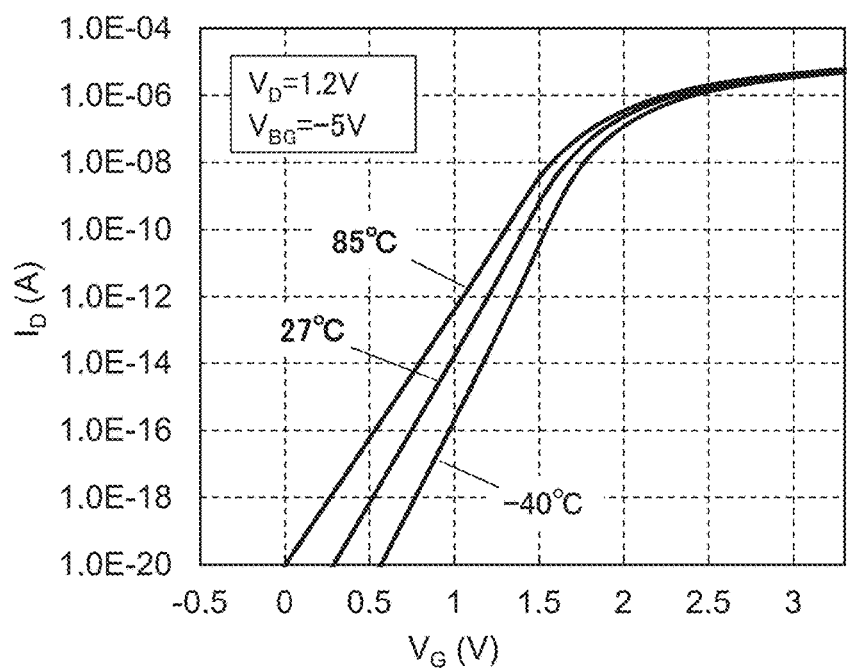
FIG. 26 shows $V_G$-$I_D$ characteristics of a transistor Tr1 that are obtained by simulation.
Figure 27:
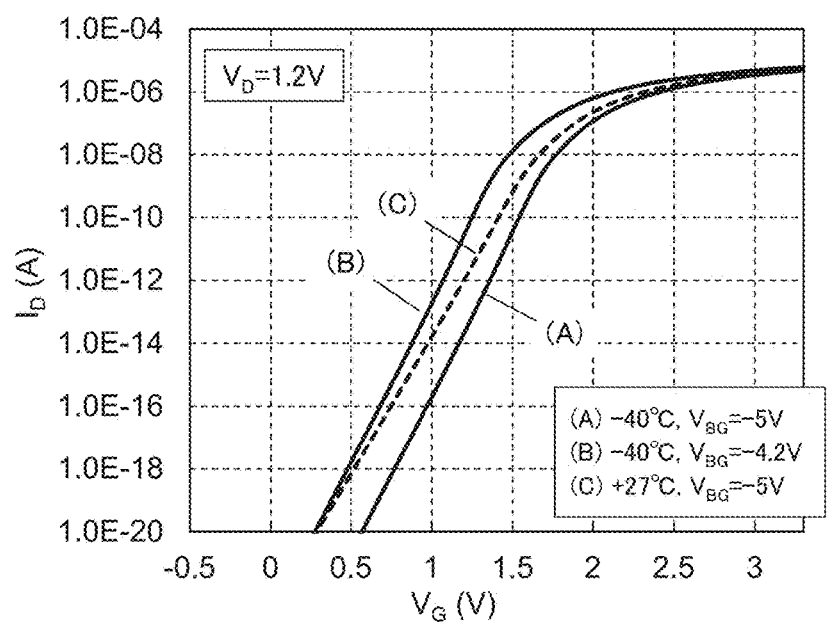
FIG. 27 shows $V_G$-$I_D$ characteristics of a transistor Tr1 that are obtained by simulation.

FIG. 26 and FIG. 27 show $V_G$ (gate voltage)-$I_D$ (drain current) characteristics of the transistor Tr1 obtained by the simulation.

FIG. 26 shows $V_G$-$I_D$ characteristics of the transistor Tr1. The back gate voltage $V_{BG}$ was fixed to −5 V, and the temperatures were set at −40° C., 27° C., and 85° C. The $V_D$ (drain current) was set to 1.2 V.

It is shown from FIG. 26 that the threshold voltage of the transistor Tr1 is shifted in the positive direction and the on-state current of the transistor Tr1 is decreased as the temperature is lowered.

FIG. 27 shows $V_G$-$I_D$ characteristics of the transistor Tr1 under three conditions below. In each of the three conditions, the drain voltage $V_D$ was 1.2 V.

(A) −40° C., $V_{BG}$=−5 V
(B) −40° C., $V_{BG}$=−4.2 V
(C) +27° C., $V_{BG}$=−5 V

The comparison between (A) and (B) shows that the threshold voltage of the transistor Tr1 was changed by −0.2 V by changing $V_{BG}$ from −5 V to −4.2 V.

In the case where the temperature correction is not performed by the semiconductor device 10, $V_{BG}$ of −5 V is assumed to be applied in the memory device 100 regardless of the temperature. In that case, it appears that the lowest on-state current is obtained under the conditions (A) shown in FIG. 27.

In the case where the temperature correction is performed by the semiconductor device 10, $V_{BG}$ of −5 V is assumed to be applied at a high temperature of 27° C. or higher ((C) shown in FIG. 27) and $V_{BG}$ of −4.2 V is assumed to be applied at a low temperature of lower than 27° C. ((B) shown in FIG. 27) in the memory device 100. In that case, it appears that the lowest on-state current is obtained under the conditions (C) shown in FIG. 27.

Next, the operation frequency of the memory device 100 was calculated. The calculation method of the operation frequency is described below.

Figure 28A:
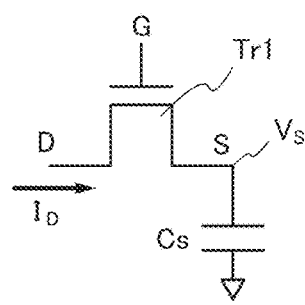
FIGS. 28A to 28C illustrate a method for calculating an operation frequency.

FIG. 28A shows the case where data is assumed to be written to the capacitor Cs shown in FIG. 8 through the transistor Tr1. In FIG. 28A, D represents a drain, G represents a gate, and S represents a source. The potential of the source of the transistor Tr1 (a voltage applied to the capacitor Cs) is represented by Vs. By turning on the transistor Tr1, the current $I_D$ flows and the capacitor Cs is charged.

Figure 28B:
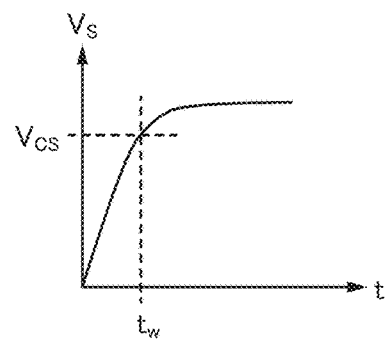

At the time when $V_S$ reaches $V_{CS}$ after the start of the charging, the charging is completed. The time at which the charging is completed is referred to as charge time $t_w$ (shown in FIG. 28B). Note that in this example, the capacitance of the capacitor Cs is assumed to be 3.5 fF and $V_{CS}$ is assumed to be 0.55 V.

Electric charges Q stored in the capacitor Cs over time t is represented by the following formula.

[Formula 1]

$$Q = I_D t = C_S V_S \quad (1)$$

According to the above formula, the charge time $t_w$ is represented by the following formula.

[Formula 2]

$$t_W = \int_0^{V_{CS}} \frac{C_S}{I_D} dV_S \quad (2)$$

Figure 28C:
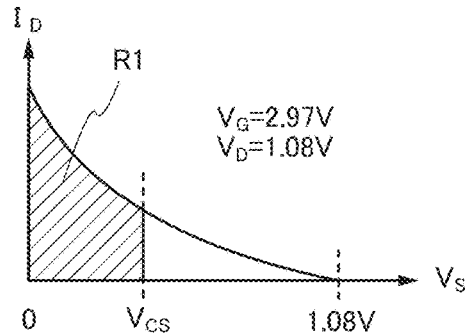

Next, a gate voltage ($V_G$=2.97 V) and a drain voltage ($V_D$=1.08 V) in the case where the capacitor Cs is charged through the transistor Tr1 were assumed, and the $I_D$-$V_S$ characteristics shown in FIG. 28C were obtained by simulation.

By integrating the formula (2) with respect to a region R1 shown in FIG. 28C, $t_w$ can be obtained.

It is assumed that the operation frequency f and the charge time $t_w$ of the memory device 100 are inversely proportional to each other.

[Formula 3]

$$F = \frac{A}{t_W} \quad (3)$$

In the formula (3), A represents a coefficient. From measurement performed in advance, the charge time is 4 ns in the case where the memory device 100 is operated at 100 MHz. Thus, the coefficient A is obtained.

The operation frequency of the memory device 100 can be calculated by substituting, into the formula (3), the coefficient A and the charge time $t_w$ obtained by the formula (2).

In the above-described manner, the operation frequency of the memory device 100 was calculated. For the calculation, the case where the temperature correction was not performed and the case where the temperature correction was performed were each assumed. For the case where the temperature correction was not performed, the conditions (A) shown in FIG. 27 were assumed. For the case where the temperature correction was performed, the conditions (C) shown in FIG. 27 were assumed. That is, the conditions achieving the lowest on-state current were assumed in each of the cases to estimate the minimum assured operation frequency. The calculation results are shown in Table 1 below.

TABLE 1

| Conditions | Operation frequency |
| --- | --- |
| Temperature correction is not performed | 100 MHz |
| Temperature correction is performed | 160 MHz |

It is estimated from Table 1 that the operation frequency of the memory device 100 is improved from 100 MHz to 160 MHz by the temperature correction.

It is found that, by correcting $V_{BG}$ using the semiconductor device 10, the memory device 100 is operated without a reduction in operation speed even in the case where the memory device 100 is placed in a low-temperature environment.

This application is based on Japanese Patent Application Serial No. 2016-185129 filed with Japan Patent Office on Sep. 23, 2016 the entire contents of which are hereby incorporated by reference.

What is claimed is:

1. A semiconductor device comprising:
a transistor; and
a first circuit,
wherein the transistor includes a first gate and a second gate,
wherein the first gate and the second gate overlap with each other with a semiconductor layer positioned therebetween,
wherein the first circuit includes a temperature sensor and a comparator,
wherein the temperature sensor is configured to obtain temperature information, and
wherein the first circuit is configured to apply, to the second gate, a voltage depending on the temperature information.

2. The semiconductor device according to claim 1, wherein the semiconductor layer includes a metal oxide.

3. The semiconductor device according to claim 1, further comprising a second circuit,
wherein the second circuit is configured to apply a negative voltage to the second gate.

4. The semiconductor device according to claim 3, wherein the second circuit is configured to hold the negative voltage.

5. The semiconductor device according to claim 4, wherein the second circuit includes a transistor including a metal oxide in a channel formation region.

6. A semiconductor device comprising:
a transistor; and
a first circuit,
wherein the transistor includes a first gate and a second gate,
wherein the first gate and the second gate overlap with each other with a semiconductor layer positioned therebetween,
wherein the first circuit includes a temperature sensor and a capacitor,
wherein the temperature sensor is configured to obtain temperature information, and
wherein the first circuit is configured to apply a voltage to the second gate through the capacitor, the voltage depending on the temperature information.

7. The semiconductor device according to claim 6, wherein the first circuit includes a comparator.

8. The semiconductor device according to claim 6,
wherein the semiconductor layer includes a metal oxide.

9. The semiconductor device according to claim 6, further comprising a second circuit,
wherein the second circuit is configured to apply a negative voltage to the second gate.

10. The semiconductor device according to claim 9,
wherein the second circuit is configured to hold the negative voltage.

11. The semiconductor device according to claim 10,
wherein the second circuit includes a transistor including a metal oxide in a channel formation region.

12. A semiconductor device comprising:
a first transistor;
a first circuit;
a voltage generation circuit; and
a second circuit,
wherein the first transistor includes a first gate and a second gate,
wherein the first gate and the second gate overlap with each other with a semiconductor layer positioned therebetween,
wherein the first circuit includes a temperature sensor and a capacitor,
wherein the voltage generation circuit is electrically connected to the second gate of the first transistor through the second circuit;
wherein the temperature sensor is configured to obtain temperature information,
wherein the first circuit is configured to apply a voltage to the second gate through the capacitor, the voltage depending on the temperature information, and
wherein the second circuit includes a second transistor including an oxide semiconductor in a channel formation region.

13. The semiconductor device according to claim 12,
wherein the first circuit includes a comparator.

14. The semiconductor device according to claim 12,
wherein the semiconductor layer in the first transistor includes a metal oxide.

15. The semiconductor device according to claim 12,
wherein the second circuit is configured to apply a negative voltage to the second gate.

16. The semiconductor device according to claim 15,
wherein the second circuit is configured to hold the negative voltage.

* * * * *